(12) United States Patent
Yamaguchi et al.

(10) Patent No.: US 7,943,500 B2
(45) Date of Patent: May 17, 2011

(54) SEMICONDUCTOR DEVICE AND METHOD OF MANUFACTURING THE SAME

(75) Inventors: Masaomi Yamaguchi, Kawasaki (JP); Yasuyoshi Mishima, Ebina (JP)

(73) Assignee: Fujitsu Limited, Kawasaki (JP)

( * ) Notice: Subject to any disclaimer, the term of this patent is extended or adjusted under 35 U.S.C. 154(b) by 264 days.

(21) Appl. No.: 12/239,912

(22) Filed: Sep. 29, 2008

(65) Prior Publication Data

US 2009/0026557 A1 Jan. 29, 2009

Related U.S. Application Data

(63) Continuation of application No. PCT/JP2006/306850, filed on Mar. 31, 2006.

(51) Int. Cl.
*H01L 21/3205* (2006.01)
(52) U.S. Cl. .............. 438/591; 257/E21.177; 438/287
(58) Field of Classification Search .......... 257/E21.177, 257/410; 438/287, 591
See application file for complete search history.

(56) References Cited

U.S. PATENT DOCUMENTS

| | | | |
|---|---|---|---|
| 7,344,934 B2 * | 3/2008 | Li | 438/199 |
| 7,371,633 B2 * | 5/2008 | Lee et al. | 438/216 |
| 2003/0003667 A1 * | 1/2003 | Morisaki et al. | 438/287 |
| 2005/0142715 A1 | 6/2005 | Sakoda et al. | |
| 2005/0151184 A1 * | 7/2005 | Lee et al. | 257/314 |
| 2005/0156257 A1 * | 7/2005 | Bojarczuk et al. | 257/410 |
| 2005/0158932 A1 | 7/2005 | Inumiya et al. | |
| 2005/0282329 A1 * | 12/2005 | Li | 438/216 |
| 2009/0008724 A1 * | 1/2009 | Mishima et al. | 257/410 |
| 2010/0025781 A1 * | 2/2010 | Lim et al. | 257/411 |
| 2010/0173487 A1 * | 7/2010 | Kaneko et al. | 438/591 |

FOREIGN PATENT DOCUMENTS

| | | |
|---|---|---|
| JP | 2004-265973 A | 9/2004 |
| JP | 2004-342775 A | 12/2004 |
| JP | 2005-158998 A | 6/2005 |
| JP | 2005-191341 A | 7/2005 |

OTHER PUBLICATIONS

International Search Report of PCT/JP2006/306850, Mailing Date of Jun. 27, 2006.

* cited by examiner

*Primary Examiner* — Allan R Wilson
(74) *Attorney, Agent, or Firm* — Westerman, Hattori, Daniels & Adrian, LLP

(57) ABSTRACT

The method of manufacturing a semiconductor device comprises; forming an HfSiO film 36 on a silicon substrate 26; exposing the HfSiO film 36 to $NH_3$ gas to thereby form an HfSiON film 38; forming an HfSiO film 40 on the HfSiON film 38; adhering Al to the surface of the HfSiO film 40 to thereby form an Al adhered layer 58 on the surface of the HfSiO film 40; and forming a polysilicon film 42 on the HfSiO film 40 with the Al adhered layer 58 formed on the surface.

16 Claims, 32 Drawing Sheets

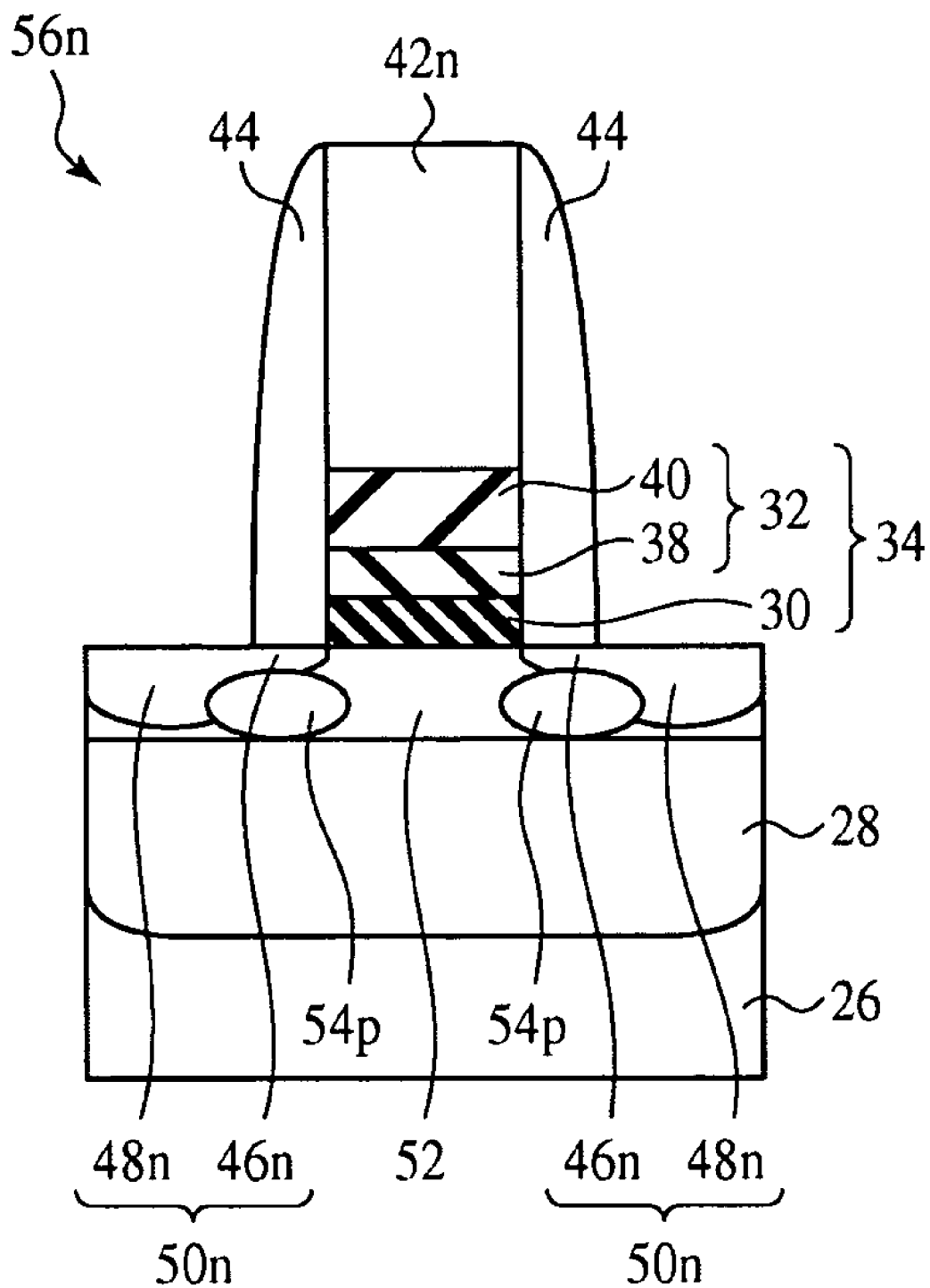

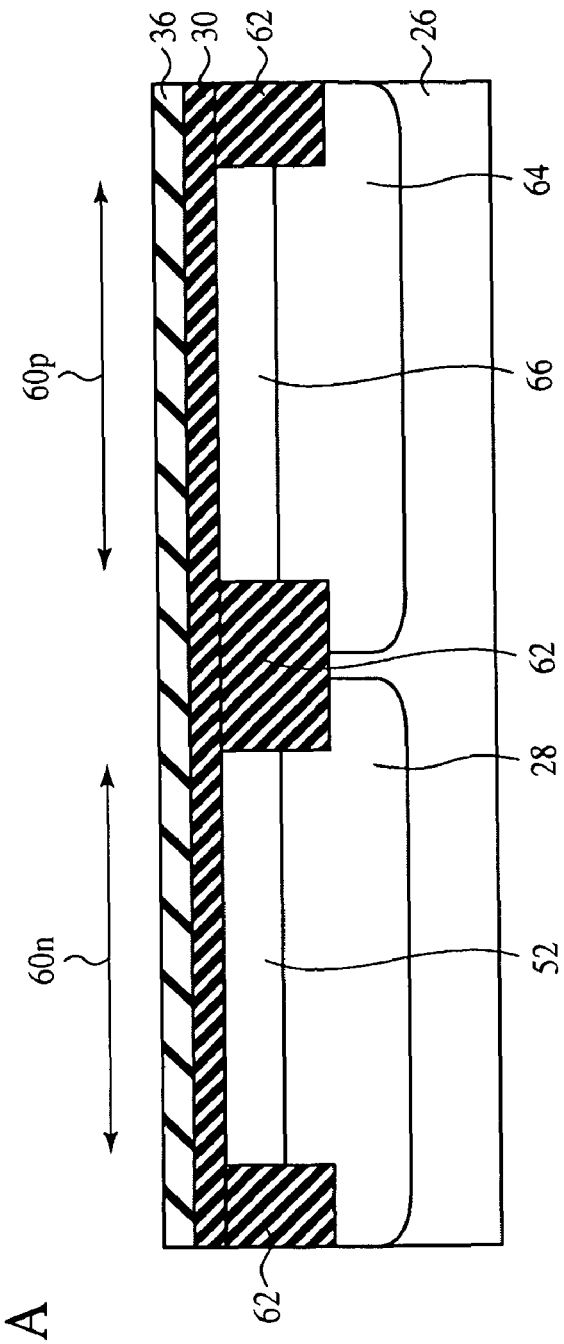
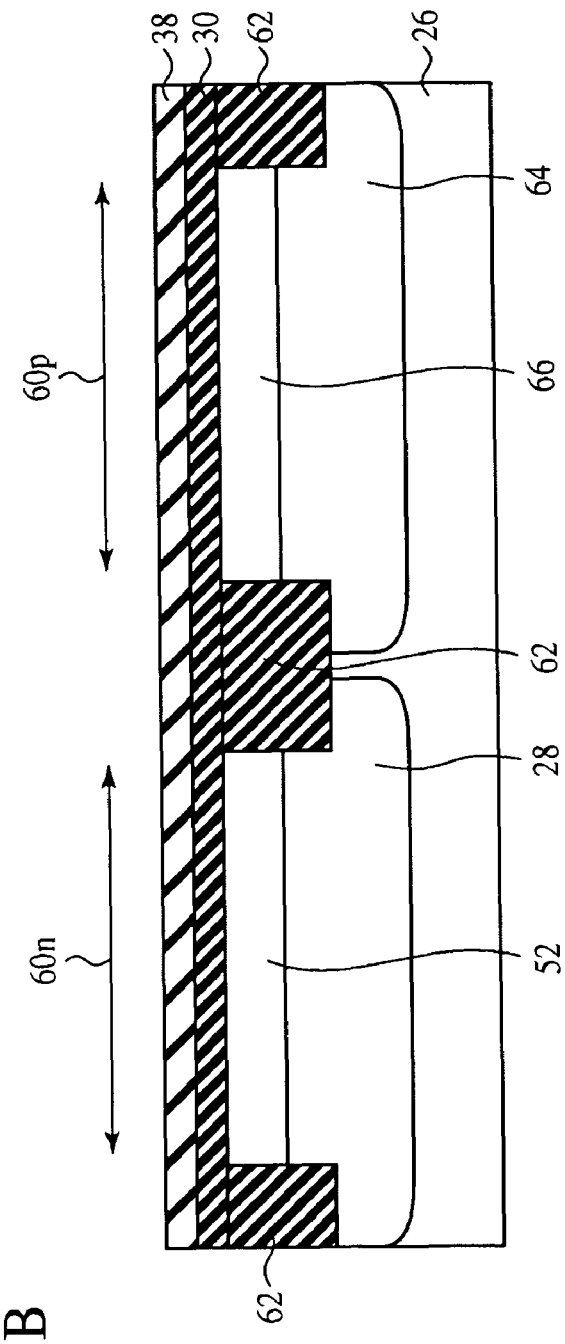
FIG. 21A
FIG. 21B

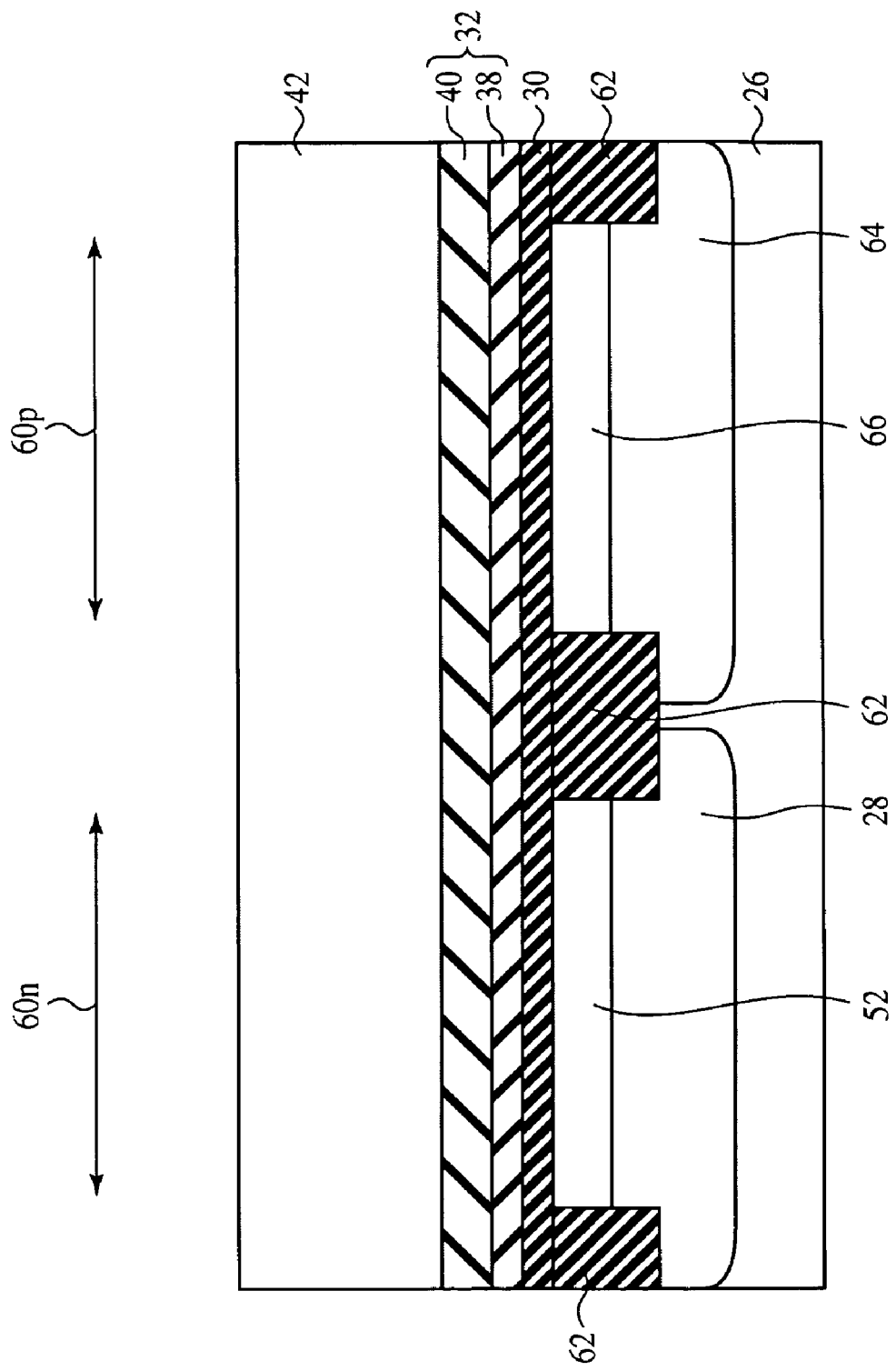

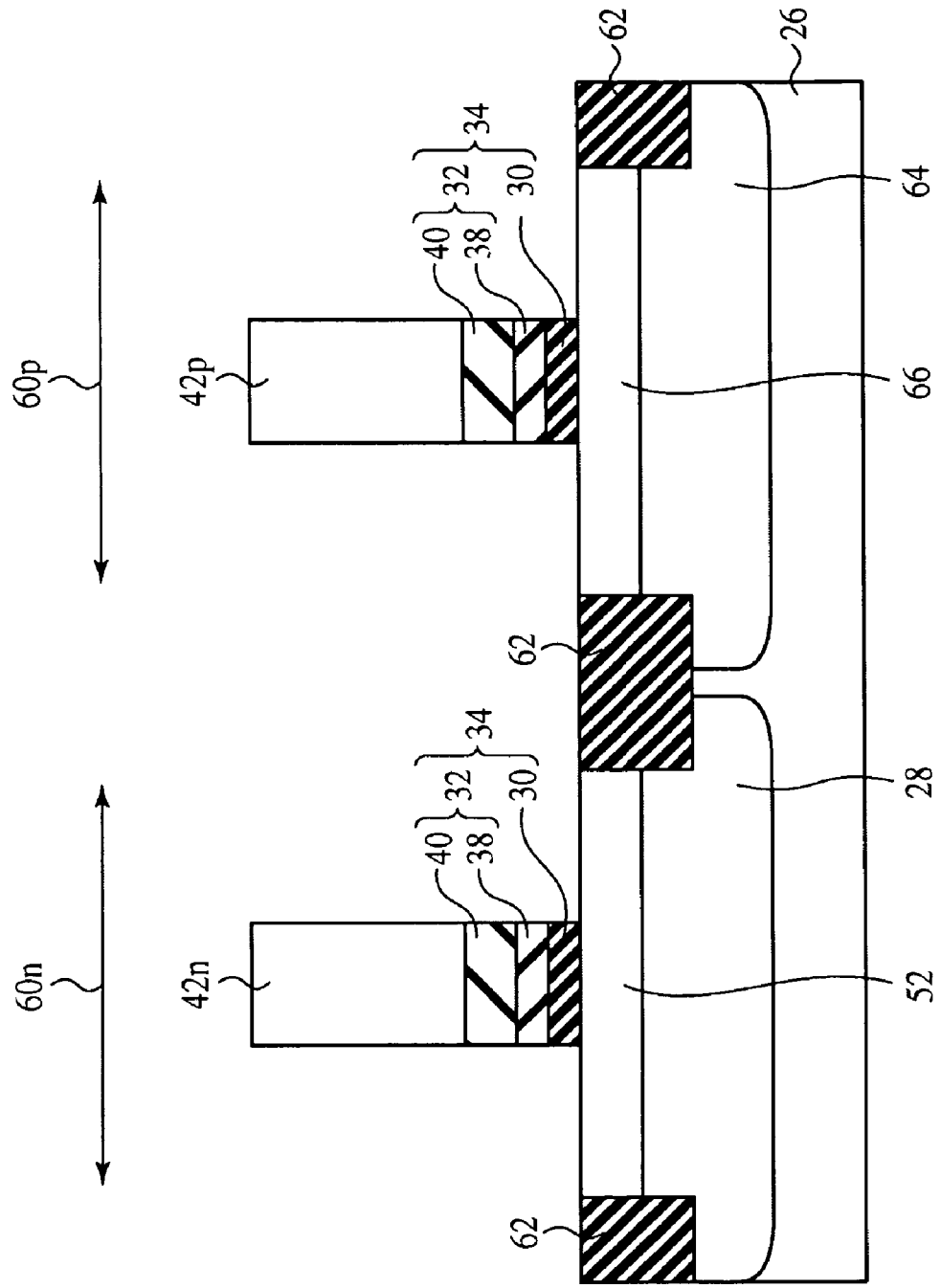

SEMICONDUCTOR DEVICE AND METHOD OF MANUFACTURING THE SAME

CROSS REFERENCE TO RELATED APPLICATIONS

This application is a Continuation of International Application No. PCT/JP2006/306850, with an international filing date of Mar. 31, 2006, which designating the United States of America, the entire contents of which are incorporated herein by reference.

TECHNICAL FIELD

The present invention relates to a semiconductor device and a method of manufacturing the same.

BACKGROUND

The high speed and the high integration of LSI have been made by downsizing MOS type FETs (Field Effect Transistors) based on the scaling rule. The downsizing of MOSFET based on the scaling rule is means for simultaneously reducing the height-wise dimension and the width-wise dimension of the respective constituent elements of a MOSFET, such as the gate insulating film of silicon oxide ($SiO_2$) and the gate length of the gate electrode, etc. Such means have made it possible for MOSFETs to retain the characteristics normal when downsized while improving the performance.

MOSFETs have so far kept on being downsized, and based on the scaling rule, the MOSFETs of the next generation need the gate insulating film of silicon oxide of a 1 nm-thickness or below. However, this film thickness range is a thickness at which the direct tunnel current starts to flow. Accordingly, the leak current cannot be suppressed, and problems of electric power consumption increase, etc. cannot be prevented.

Then, it is proposed to use a high dielectric constant material having a higher dielectric constant than silicon oxide as a material for a gate insulating film to thereby decrease the physical film thickness while the effective film thickness converted into silicon oxide film is kept below 1 nm including 1 nm. For example, oxides (oxynitrides) of hafnium (Hf) as the main component have high dielectric constants which are higher by about several times to 10 times the dielectric constant of silicon oxide. Accordingly, the Hf-based high dielectric constant insulating film of oxides (oxynitrides) of Hf as the main component are expected to be the gate insulating film material of the next generation.

On the other hand, for the material of the gate electrode, the use of a metal material is being studied. The metal gate of the metal material has the merits that the depletion does not take place and additionally that the gate resistance can be decreased. However, the metal gate has poor heat resistance and furthermore, it is difficult to control the work function. As the material of the gate electrode, polysilicon is considered to be still leading.

Thus, it is urgent to develop an MOSFET combining the gate electrode of polysilicon and the Hf-based high dielectric constant insulating film.

Conventionally, when the Hf-based high dielectric constant insulating film is used in the gate insulating film, a silicon oxide film or silicon oxide nitride film of a 0.8 nm-thickness or below is formed on a silicon substrate as the process before the Hf-based high dielectric constant insulating film is formed, and the Hf-based high dielectric constant insulating film is formed thereon by CVD. After the Hf-based high dielectric constant insulating film has been formed, the thermal processing called PDA (Post Deposition Anneal) is made, and then a polysilicon film to be the gate electrode is simply deposited.

Background arts are disclosed in, e.g., Japanese published unexamined patent application No. 2005-191341 and Japanese published unexamined patent application No. 2005-158998.

SUMMARY

According to one aspect of an embodiment, there is provided a semiconductor device comprising: a gate insulating film formed over a semiconductor substrate, and including a first high dielectric constant insulating film having a nitrogen concentration x of x>0 and a second high dielectric constant insulating film formed over the first high dielectric constant insulating film, having a nitrogen concentration y of $0 \leq y < x$ and containing Al; and a gate electrode formed over the gate insulating film and containing Si.

According to another aspect of an embodiment, there is provided a method of manufacturing a semiconductor device comprising: forming a first high dielectric constant insulating film over a semiconductor substrate; forming a second high dielectric constant insulating film over the first high dielectric constant insulating film; adhering Al to a surface of the second high dielectric constant insulating film to thereby form an Al adhered layer on the surface of the second high dielectric constant insulating film; forming a conductive film containing Si over the second high dielectric constant insulating film with the Al adhered layer formed on the surface; and patterning the conductive film to form a gate electrode of the conductive film.

BRIEF DESCRIPTION OF THE DRAWINGS

FIGS. 8A-8D and 9A-9C are sectional views showing the method of manufacturing the MOS structure the present invention is applied to;

FIG. 13 is a diagrammatic sectional view showing the structure of the semiconductor device according to a first embodiment of the present invention;

FIGS. 20A-20B, 21A-21B, 22A-22B, 23, 24, 25, 26, 27, 28, 29 and 30 are sectional views showing the method of manufacturing the semiconductor device according to the second embodiment of the present invention;

DETAILED DESCRIPTION OF THE EMBODIMENTS

It is known that when a gate electrode of polysilicon is formed on a (nitrided) hafnium silicate (HfSiO(N)) film, the phenomenon called Fermi level pinning takes place. The Fermi level pinning is the phenomenon that the Fermi levels of the n-type polysilicon and the p-type polysilicon are drawn to the substantially same level by the interaction between the HfSiO(N) and the polysilicon as if pinned.

Figure 31:
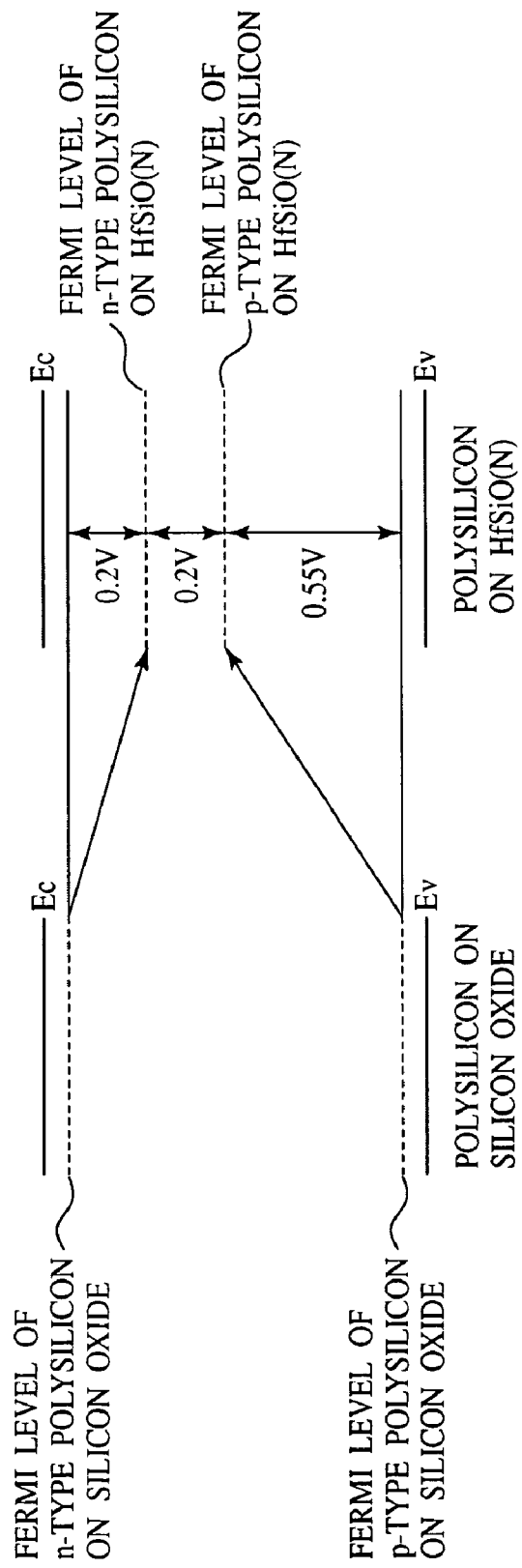
FIG. 31 is an energy band diagram explaining the Fermi level pinning.

FIG. 31 is an energy band diagram explaining the Fermi level pinning. The energy band diagram on the left side of the drawing shows the Fermi level of polysilicon on silicon oxide, and the energy band diagram on the right side of the drawing shows the Fermi level of the polysilicon on HfSiO(N). In the respective energy band diagrams, for the conduction bands $E_c$ and the valence band $E_v$ indicated by the solid lines, the Fermi levels of the n-type and the p-type polysilicon are indicated by the broken lines.

As shown, the Fermi level of the p-type polysilicon on the HfSiO(N) shifts to the minus side by 0.55 V from the Fermi level of the p-type polysilicon on the silicon oxide. The Fermi level of the n-type polysilicon on the HfSiO(N) shifts by 0.2 V to the plus side from the Fermi level of the n-type polysilicon on the silicon oxide. Thus, the polysilicon on the HfSiO(N) has a difference of 0.2 V between the p-type and the n-type, and the difference is smaller in comparison with that of the polysilicon on the silicon oxide.

When the Fermi level pinning takes place, for example, the flat band voltage $V_{fb}$ shifts to the minus side by about 0.55 V in the PMOS diode, and the flat band voltage $V_{fb}$ shifts to the plus side by about 0.2 V in the NMOS diode. Resultantly, the difference of the flat band voltages $V_{fb}$ between the PMOS diode and the NMOS diode, which is about 1.8 V when silicon oxide film is used as the gate insulating film becomes about 1.05 V due to the Fermi level pinning.

It is considered that such shift of the flat band voltage $V_{fb}$ causes the shift of the threshold voltage $V_{th}$ of the MOSFET.

Figure 32:
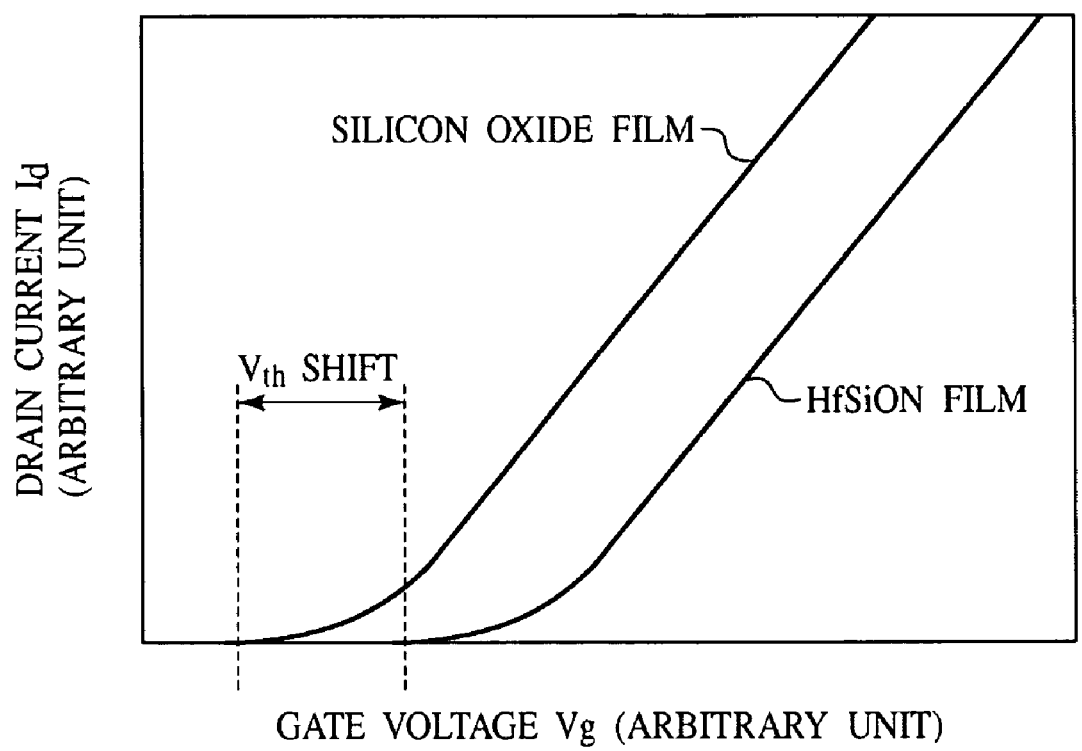
FIG. 32 is a graph of the current-voltage characteristics of the MOSFET using silicon oxide film as the gate insulating film and the MOSFET using HfSiON film as the gate insulating film.

FIG. 32 is a graph of the current-voltage characteristics of the MOSFET using silicon oxide film as the gate insulating film and the MOSFET using HfSiON film as the gate insulating film. On the horizontal axis of the graph, the gate voltage $V_g$ is taken, and the drain current $I_d$ is taken on the vertical axis.

As shown, the threshold voltage $V_{th}$ of the MOSFET using the HfSiON film as the gate insulating film shifts to the plus side from the threshold voltage $V_{th}$ of the MOSFET using silicon oxide film as the gate insulating film. It is considered that such shift of the threshold voltage $V_{th}$ is caused by the shift of the flat band voltage $V_{fb}$.

As described above, when the Hf-based high dielectric constant insulating film is used in the gate insulating film, the Fermi level pinning takes place, and the electric characteristics of the MOSFET are deteriorated. The Fermi level pinning is the phenomenon caused only when the gate electrode of Si as the main component is used, and, based on this, it is considered that the cause for the Fermi level pinning is present in the interface between the polysilicon and the HfSiO (N).

Principle of the Present Invention

The principle of the present invention will be explained with reference to FIGS. 1A to 12B.

Concerning the mechanism of the Fermi level pinning generating in the combination of the Hf-based high dielectric constant insulating film and the polysilicon film, various theories have been so far made.

Among the theories, the theory that the Fermi level pinning is caused by the HfSiO(N) film losing oxygen atoms to have oxygen holes is becoming dominant. According to this dominant theory, electrons generated by the generation of the oxygen holes transit into the polysilicon film, and the electron distribution in the interface between the polysilicon film and the HfSiO(N) film becomes ununiform, which causes the Fermi level pinning.

Another theory is that Hf—Si bonds cause the Fermi level pinning. According to this theory, the bond level of the Hf—Si generates in the band gap, which causes the Fermi level pinning.

However, none of the theories have so far presented decisive evidences endorsing them.

The inventors of the present application have made earnest studies and have found that in the stacked structure of a polysilicon film/a HfSiO(N) film/an interface layer/a silicon substrate, an interface reaction takes place in the interface between the polysilicon film and the HfSiO(N) film. The interface layer formed on the silicon substrate is a silicon oxide film or a silicon oxynitride film formed on the surface of the channel region surface of a MOS transistor for chemically and electrically stabilizing the silicon substrate surface.

The interface reaction generating in the interface between the polysilicon film and the HfSiO(N) film makes it difficult to make this interface electrically good. It is experimentally observed that such interface reaction causes the Fermi level pinning. It is considered that consequently, the deterioration of the electric characteristics, such as the increase of the threshold voltage $V_{th}$, etc., takes place in the MOS transistor. The shift of the threshold voltage $V_{th}$ is considered to be caused by the shift of the flat band voltage $V_{fb}$.

Then, in order to suppress the interface reaction in the interface between the polysilicon film and the HfSiON(N) film, the inventors of the present application have obtained the idea that the interface is processed with aluminum (Al).

It is known that Al strongly bonds with oxygen (O) and reacts also with Si. The Fermi level spinning is the phenomena involving Si, Hf, O, etc. Accordingly, there is a possibility of processing the interface between the polysilicon film and the HfSiO(N) film with Al to thereby suppress the Fermi level pinning.

To confirm the effect of suppressing the Fermi level pinning with Al, the inventors of the present application prepared a MOS diode using HfSiO(N) film in the gate insulating film (capacitor insulating film) and measured electric characteristics on the prepared sample.

First, the method of manufacturing the MOS diode used in the measurement will be explained with reference to FIGS. 1A-1C and 2A-2B. FIGS. 1A-1C and 2A-2B are sectional views showing the method of manufacturing the MOS diode.

Figure 1A:
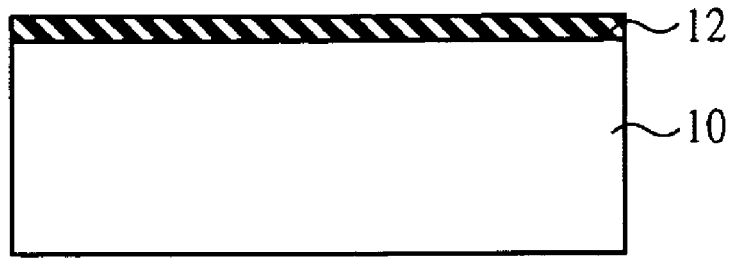
FIGS. 1A-1C and 2A-2B are sectional views showing a method of manufacturing a MOS diode used in the measurement for confirming the effect of suppressing the Fermi level pinning by Al.

First, the natural oxide film on the surface of a p-type silicon substrate 10 whose primary surface is (100) face was removed with diluted fluoric acid, and then on the surface of the silicon substrate 10, a 1 nm-thickness silicon oxide film (chemical oxide film) 12 was formed (FIG. 1A).

Figure 1B:
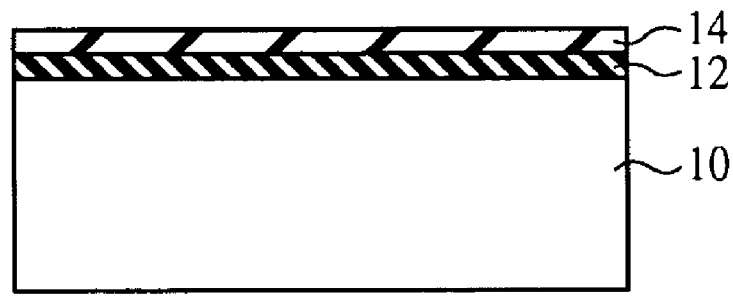

Next, on the silicon oxide film 12, a 4 nm-thickness HfSiO film 14 as the gate insulating film (capacitor insulating film) was deposited by CVD (FIG. 1B). The formed HfSiO film 14 contained nitrogen. The conditions for forming the HfSiO film were tetrakis(dimethylamino)hafnium (TDMAH: Hf $(N(CH_3)_2)_4$), tris(dimethylamino)silane (TDMAS: $SiH(N(CH_3)_2)_3$), nitrogen monoxide (NO) and nitrogen ($N_2$) gas of the carrier gas as the source gas, and the substrate temperature of 600° C. The composition of the formed nitrogen-content HfSiO film 14 was $(Hf_{0.6}Si_{0.4})(O_{0.9}N_{0.1})$.

Then, the Al processing of adhering Al to the surface of the HfSiO film 14 was made. In the Al processing, the gas of the liquid raw material of tritertiarybutylaluminum (TTBA: $Al(C_4H_9)_3$) bubbled with nitrogen gas of 300 sccm under the conditions of 20° C. and 50 kPa was sprayed to the surface of the HfSiO film 14 with the substrate temperature set at 600° C.

Figure 1C:
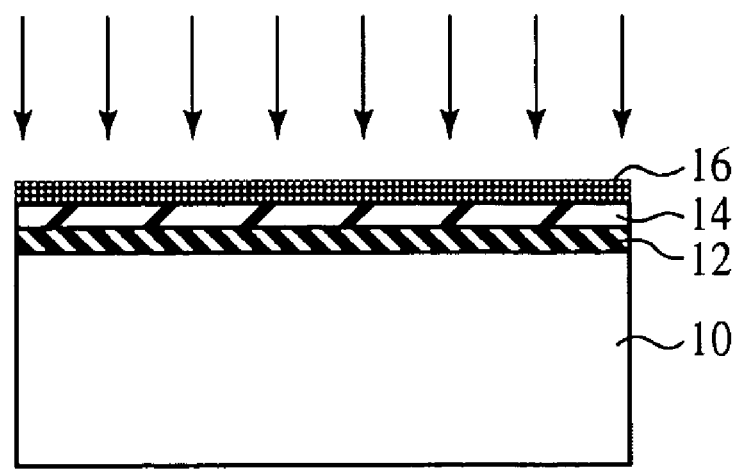

Thus, by the Al processing of spraying TTBA, an Al adhered layer 16 of Al adhering to the surface of the HfSiO film 14 was formed (FIG. 1C).

Here, the result of analyzing whether or not the Al has adhered by the Al processing by Auger electron spectroscopy (AES) will be explained with reference to FIGS. 3 and 4.

Figure 3:
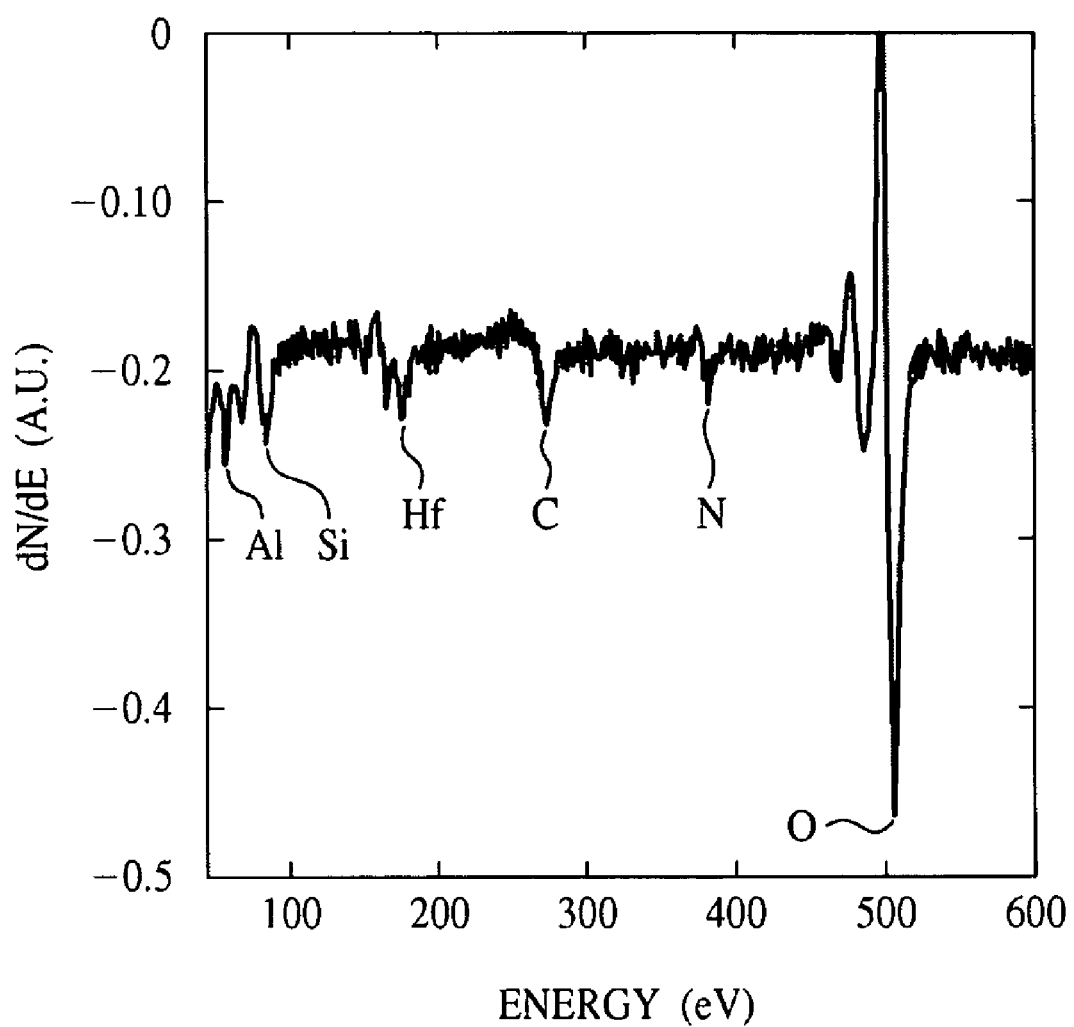
FIG. 3 is an Auger electron spectrum showing the result of analyzing by AES the surface of HfSiO film subjected to Al processing of spraying TTBA.

FIG. 3 is the Auger electron spectrum of the result of analyzing by AES the surface of the HfSiO film subjected to the Al processing of spraying TTBA with the substrate temperature set at 600° C. Based on the spectrum, the presence of Al can be confirmed.

Figure 4:
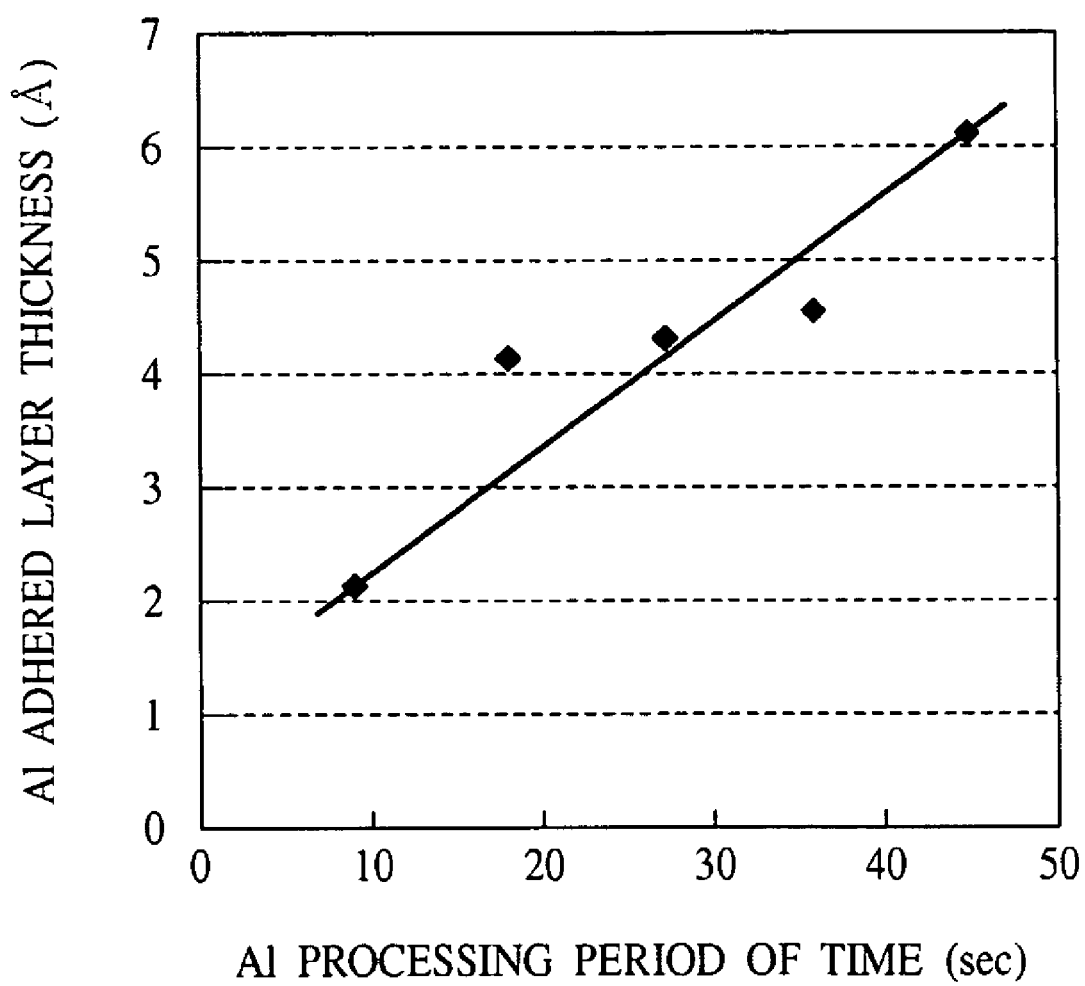
FIG. 4 is a graph of the dependency of the thickness of the Al adhered layer on the period of time of the Al processing of spraying TTBA.

FIG. 4 is the graph of the dependency of the thickness of the Al adhered layer on the period of time of the Al processing of spraying TTBA. The period of time of the Al processing is taken on the horizontal axis of the graph, and on the vertical axis, the thickness of the Al adhered layer is taken. The thickness of the Al adhered layer was measured with a spectroscopic ellipsometer. Based on the graph, it is seen that as the period of time of the Al processing is longer, the thickness of the Al adhered layer increases. The thickness of the Al adhered layer has the order of several angstroms.

Samples which were subjected to the Al processing respectively for 5 seconds, 10 seconds and 15 seconds were prepared. A reference sample, whose Al processing period of time is zero, in other words, which was not subjected to the Al processing, was also prepared.

After the Al processing was made on the HfSiO film 14, thermal processing of 800° C. of 30 seconds was made as the post deposition anneal.

Then, on the HfSiO film 14 subjected to the Al processing, a 100 nm-thickness polysilicon film 18 was deposited by CVD with the substrate temperature set at 600° C. (FIG. 2A), Then, an impurity of a prescribed conduction type is ion-implanted into the polysilicon film 18. Then, thermal processing of 1050° C. and 1 second was made to activate the impurity ion-implanted in the polysilicon film 18. Then, a metal electrode (not illustrated) was deposited on the polysilicon film 18.

Figure 2A:
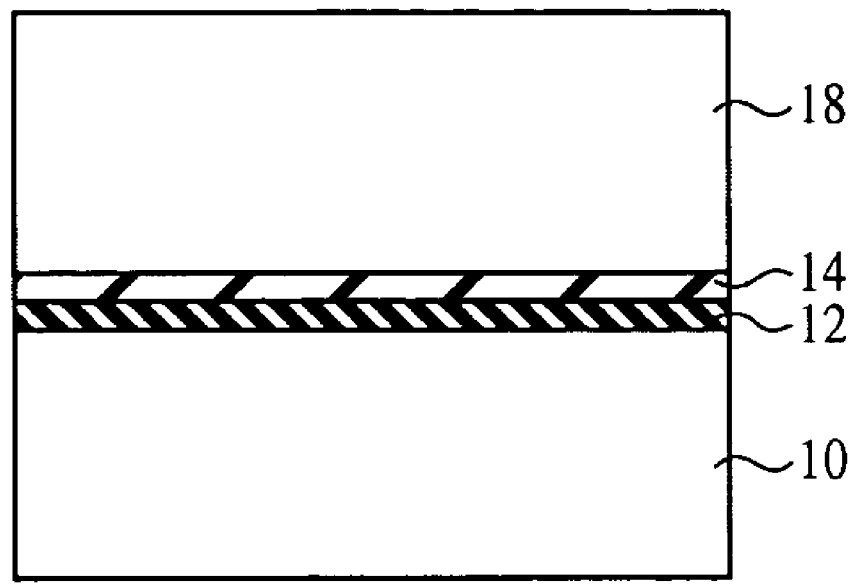
Figure 2B:
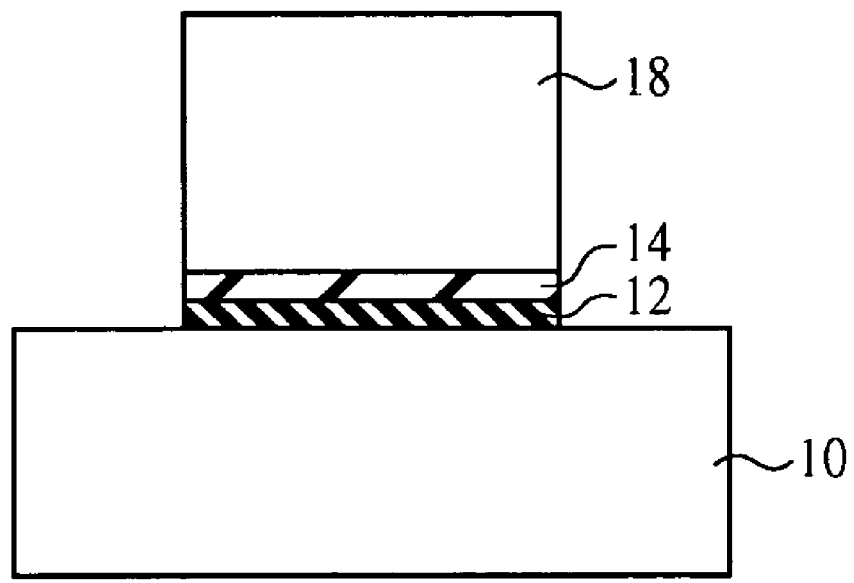

Then, by photolithography and etching, an 80 μm×80 μm diode was formed (FIG. 2B).

Samples with a p-type impurity ion-implanted and samples with an n-type impurity ion-implanted were prepared respectively for 0 second of the Al processing, 10 seconds of the Al processing and 15 seconds of the Al processing.

As described above, the NMOS diode samples and the PMOS diode samples were prepared respectively for 0 second of the Al processing and 5 seconds of the Al processing and 15 seconds of the Al processing, and capacitance-voltage characteristics were measured on the respective samples.

Figure 5A:
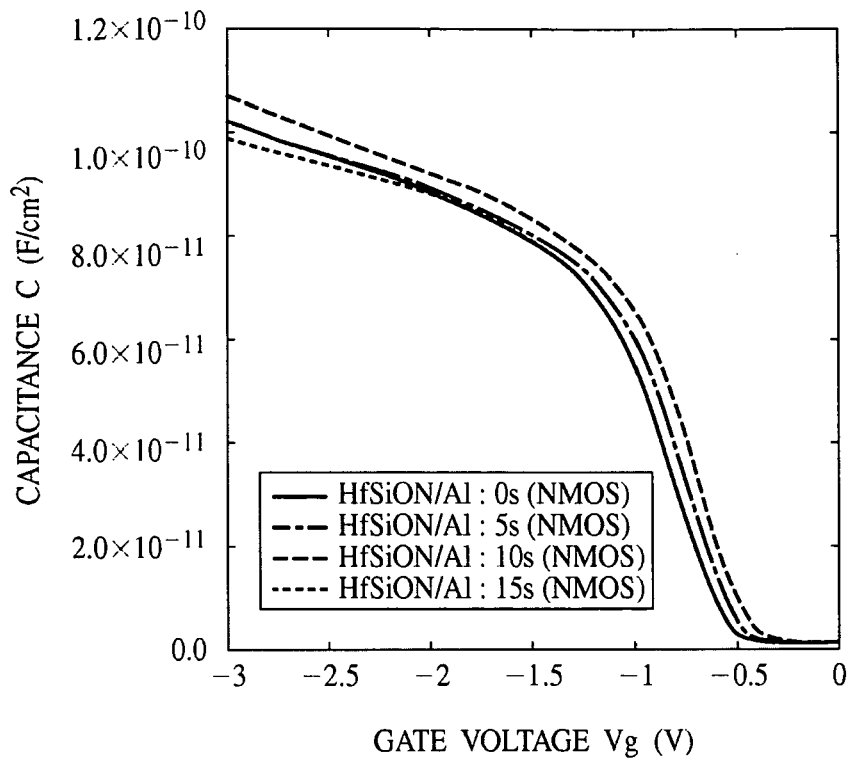
FIGS. 5A and 5B are graphs of the result of measuring the capacitance-voltage characteristics of the MOS diode subjected to the Al processing.
Figure 5B:
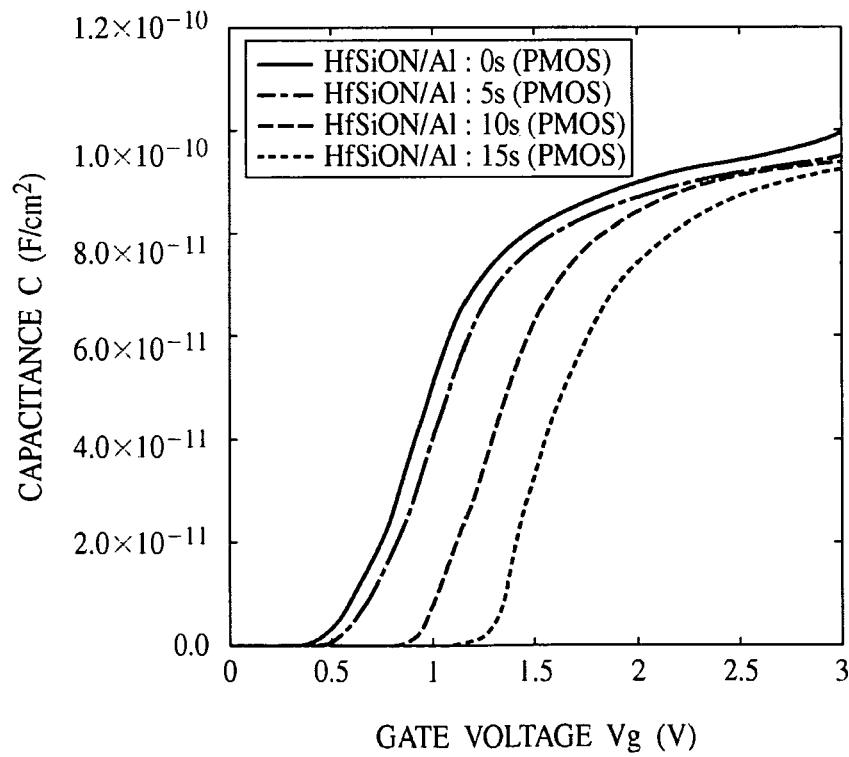

FIG. 5A is the graph of the capacitance-voltage characteristics measured on the NMOS diodes. FIG. 5B is the graph of the capacitance-voltage characteristics measured on the PMOS diodes. In FIGS. 5A and 5B, the gate voltage $V_g$ is taken on the horizontal axis, and the capacitance C is taken on the vertical axis.

Based on the graphs of FIGS. 5A and 5B, the flat band voltage $V_{fb}$ was estimated for each sample.

In the NMOS diodes, as shown in FIG. 5A, as voltages are applied from the gate voltage $V_g$=0 V to the minus direction, the capacitance C increases with the increase of the gate voltage $V_g$. The capacitance C begins to be saturated when the gate voltage $V_g$ arrives at a prescribed value. At this time, in the duration from the time when the capacitance C starts to increase to the time when the capacitance C starts to be saturated, an inflection point is present in the capacitance-voltage curves. The value of the gate voltage $V_g$ on the horizontal axis the inflection point is extended to and arrives at corresponds to the flat band voltages $V_{fb}$.

In the PMOS diodes, as shown in FIG. 5B, as the voltage is applied from the gate voltage $V_g$=0 V in the plus direction, the capacitance C increases with the increase of the gate voltage $V_g$. The capacitance C begins to be saturated when the gate voltage $V_g$ arrives at a prescribed value. At this time, in the duration from the time when the capacitance C starts to increase to the time when the capacitance C starts to be saturated, an inflection point is present in the capacitance-voltage curves. The value of the gate voltage $V_g$ on the horizontal axis the inflection point is extended to and arrives at corresponds to the flat band voltages $V_{fb}$.

Thus, the flat band voltages $V_{fb}$ of the respective samples of the NMOS diodes were estimated based on the graph of FIG. 5A, and the flat band voltages $V_{fb}$ of the respective samples of the PMOS diodes were estimated based on the graph of FIG. 5B.

Figure 6:
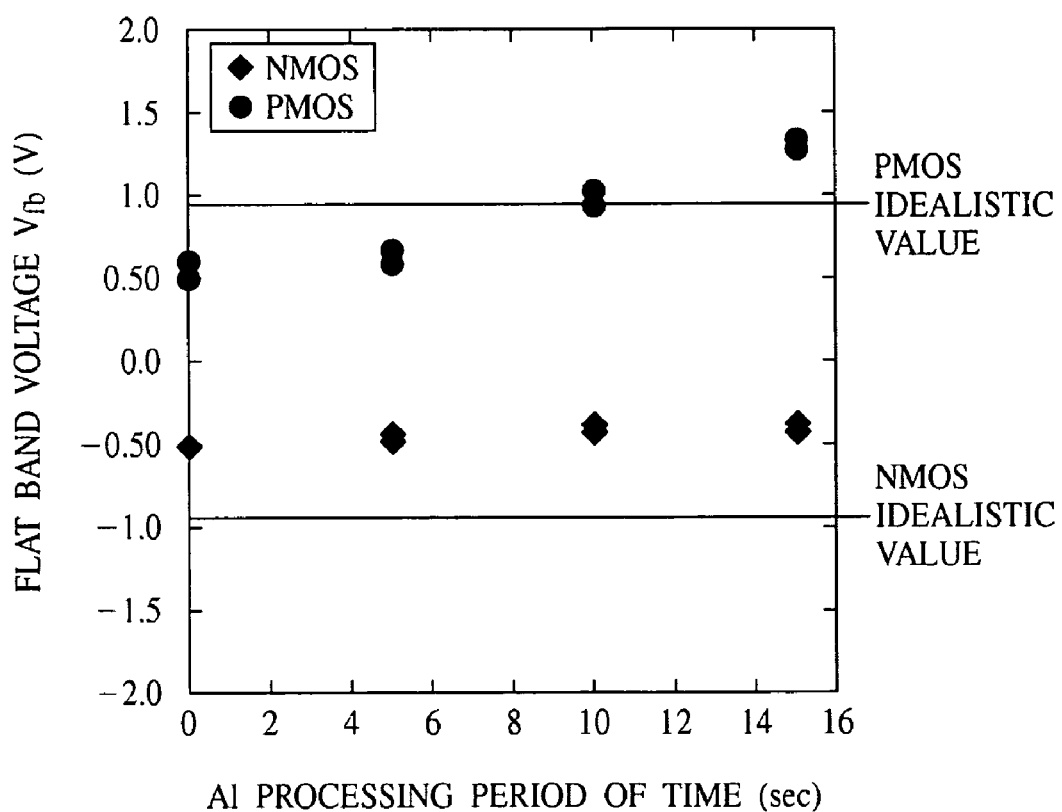
FIG. 6 is a graph of the flat band voltages $V_{fb}$ of the MOS diode subjected to the Al processing plotted for periods of time of the Al processing.

FIG. 6 is the graph of the flat band voltages $V_{fb}$ estimated based on the graphs of FIGS. 5A and 5B plotted for the Al processing periods of time. On the horizontal axis of the graph, the Al processing period of time is taken, and on the vertical axis, the flat band voltage $V_{fb}$ is taken.

"NMOS idealistic value" in the graphs of FIG. 6, and FIGS. 7 and 10 mentioned later means the value of the flat band voltage $V_{fb}$ of the NMOS diode using silicon oxide film as the gate insulating film (capacitor insulating film), and "PMOS idealistic value" means the value of the PMOS diode using silicon oxide film as the gate insulating film. In the MOS diodes using silicon oxide film as the gate insulating film, the Fermi level pinning does not take place, and furthermore, no fixed charge is present in the gate insulating film. The flat band voltages $V_{fb}$ are idealistic.

In the idealistic case using silicon oxide film as the gate insulating film, the difference between the Fermi level of the polysilicon film of the NMOS diode and the Fermi level of the polysilicon film of the PMOS diode is about 1.0 V. This Fermi level difference corresponds to about 1.8 V in terms of difference of the flat band voltage $V_{fb}$.

On the other hand, based on the measured result shown in FIG. 6 of the MOS diode using HfSiO film as the gate insulating film, the following is seen.

In the samples including the HfSiO film without the Al processing, the $V_{fb}$ shift ($\Delta V_{fb}$) from the idealistic value $V_{fb}$ was about +0.45 V in the NMOS diodes, and $\Delta V_{fb}$ was about −0.5 V in the PMOS diode. This is the state where the Fermi level pinning is taking place. Usually in the state where the Fermi level pinning is taking place, $\Delta V_{fb}$ is about +0.2 V in the NMOS diode and is about −0.6 V in the PMOS diode. The shift of the measured values from these values will be because the values of the measured result contain some influences or errors due to the fixed charges.

In contrast to this, in the samples including the HfSiO film subjected to the Al processing for 15 seconds, the $\Delta V_{fb}$ was about +0.55 V in the NMOS diodes and about +0.5 V in the PMOS diodes. With the Al processing of 15 seconds, the difference in the $V_{fb}$ between the NMOS diode and the PMOS diode is about 1.85 V, which is near 1.8 V of the idealistic $V_{fb}$ difference.

With the Al processing made on the HfSiO film for 15 seconds, the flat band voltage $V_{fb}$ shifted to the plus side by about 1 V in the PMOS diode from the flat band voltage $V_{fb}$ without the Al processing but, in the NMOS diode, shifted to the plus side only by about 1V. Resultantly, with the Al processing made for 15 seconds, the difference in the Fermi level between the polysilicon film of the NMOS diode and the polysilicon film of the PMOS diode is about 1 V. Usually when the Fermi level pinning is taking place, the difference in the Fermi level between the polysilicon film of the NMOS diode and the polysilicon film of the PMOS diode is about 0.2 V. Accordingly, with the Al processing made for 15 seconds, it is considered that the Fermi level pinning does not take place.

As described above, the Al processing is made on the HfSiO film for 15 seconds, whereby the generation of the Fermi level pinning is suppressed, and the difference in the $V_{fb}$ between the NMOS diode and the PMOS diode is about 1.85 V, which is near 1.8 V of the idealistic $V_{fb}$ difference.

However, the Al processing, on one hand, suppresses the generation of the Fermi level pinning, but it is experimentally seen that, on the other hand, the Al and alumina generate fixed charges. Due to fixed charges of the Al, when the Al processing is simply made for 15 seconds, both the NMOS diode and the PMOS diode have the $\Delta V_{fb}$ of about +0.5 V.

As a method for returning to the minus side the shift of the flat band voltage $V_{fb}$ toward the plus side, i.e., approaching the $\Delta V_{fb}$ to 0, it is considered to nitride the HfSiO film by the $NH_3$ processing of exposing the HfSiO film to ammonia ($NH_3$) gas. It is known that the HfSiO film without polysilicon film deposited on is nitrided by the $NH_3$ processing, whereby the flat band voltage $V_{fb}$ shifts to the minus side both in the NMOS diode and the PMOS diode.

Then, the inventors of the present application made the same experiment as described above with the HfSiO film nitrided by the $NH_3$ processing and investigated the dependency of the flat band voltage $V_{fb}$ on the Al processing period of time.

The $NH_3$ processing was made after the HfSiO film was deposited and before the Al processing. The conditions for the $NH_3$ processing were the substrate temperature of 780° C., the $NH_3$ flow rate of 1 slm, the pressure of 100 Pa, and 10 minutes processing period of time. The nitrogen concentration of the HfSiON film given by nitriding the HfSiO film by the $NH_3$ processing was about 25 atm %.

Figure 7:
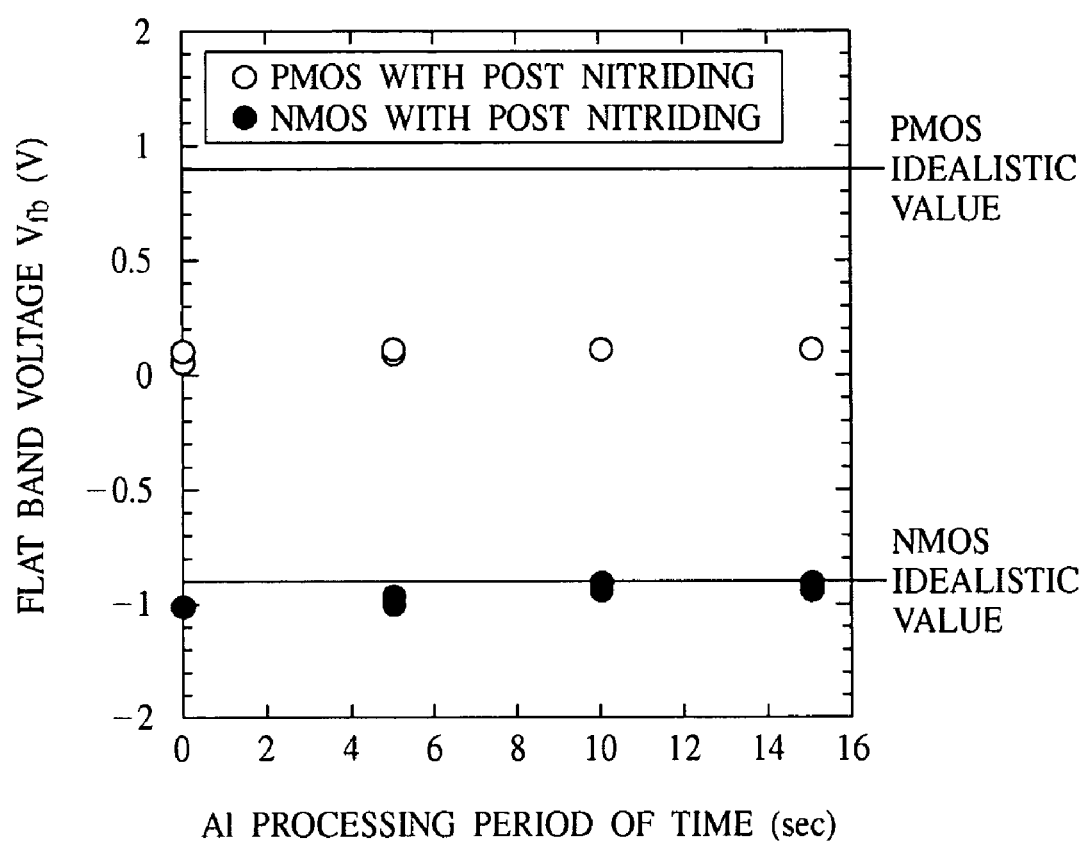
FIG. 7 is a graph of the flat band voltages $V_{fb}$ of the MOS diode subjected to the $NH_3$ processing and the Al processing plotted for periods of time of the Al processing.

FIG. 7 is the graph of the flat band voltages $V_{fb}$ given by making both the $NH_3$ processing and the Al processing plotted for the periods of time of the Al processing. The Al processing period of time is taken on the horizontal axis of the graph, and on the vertical axis, the flat band voltage $V_{fb}$ is taken.

With the Al processing of 0 second, in the case with the $NH_3$ processing, comparison to the case without the $NH_3$ processing shown in FIG. 6, the flat band voltage $V_{fb}$ shifts by 0.5 V to the minus side both in the PMOS diode and the NMOS diode.

In the cases where the $NH_3$ processing was made, the flat band voltage $V_{fb}$ does not substantially change for the increases of the Al processing period of time. Based on this result, it is seen that the $NH_3$ processing suppresses the effect of the Al processing.

Accordingly, it is difficult to suppress the generation of the Fermi level pinning and control the flat band voltages $V_{fb}$ of the NMOS diode and the PMOS diode at the idealistic values by simply making the $NH_3$ processing and the Al processing on the surface of the HfSiO film, which is the interface with the polysilicon film.

In order to control the generation of the Fermi level pinning and control the flat band voltage $V_{fb}$ at the idealistic value, it is necessary to separately make the Al processing and the $NH_3$ processing as follows.

First, the effect of the Al processing is to suppress the Fermi level pinning. The Fermi level pining is caused by the phenomena taking place near the interface between the polysilicon film and the HfSiO(N) film. Accordingly, the Al processing must be made near the interface between the HfSiO film and the polysilicon film.

In contrast to this, the $NH_3$ processing is not made near the interface between the HfSiO film and the polysilicon film but must be made on the part of the HfSiO film, which is on the side of the silicon substrate, not to suppress the effect of the Al processing.

The present invention was made based on this knowledge, and in the present invention, the $NH_3$ processing is made on a first HfSiO film formed on a substrate, a second HfSiO film to be the underlying layer of a polysilicon film is formed on the first HfSiO film nitrided by the $NH_3$ processing, and the Al processing is made on the second HfSiO film. The stacked structure of the HfSiO films is thus formed, whereby the generation of the Fermi level pinning can be suppressed, the shift of the flat band voltage $V_{fb}$ can be suppressed, and the flat band voltage $V_{fb}$ is controlled to be the idealistic value given when silicon oxide film is used as the gate insulating film.

The method of manufacturing the MOS structure the present invention is applied to will be explained with reference to FIGS. 8A-8D and 9A-9C. FIGS. 8A-8D and 9A-9C are sectional views showing the method of manufacturing the MOS structure the present invention is applied to.

Figure 8A:
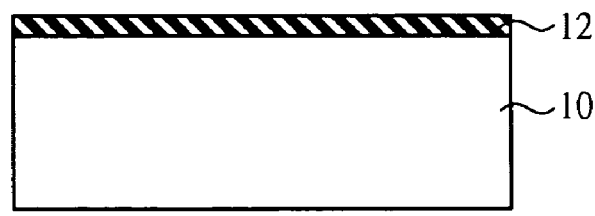
Figure 8B:
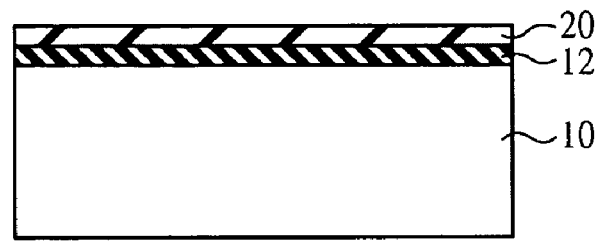

First, the natural oxide film on the surface of a silicon substrate 10 is removed with diluted fluoric acid, and then a silicon oxide film (chemical oxide film) 12 is formed on the surface of the silicon substrate 10 (FIG. 8A). In place of the silicon oxide film, a silicon oxynitride film may be formed.

Figure 8C:
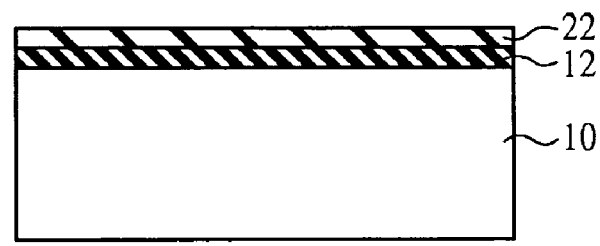
Figure 8D:
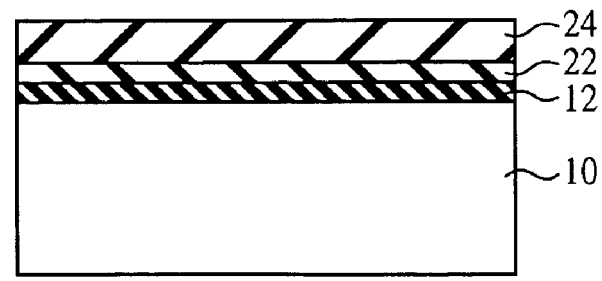

Then, a HfSiO film 20 of, e.g., an about 1 nm-thickness is deposited on the silicon oxide film 10 by CVD (FIG. 8D). The conditions for forming the HfSiO film 20 are, e.g., TDMAH, TDMAS, nitrogen monoxide gas and nitrogen gas of the carrier gas as the source gas, the substrate temperature of 600° C. and the nitrogen concentration of the HfSiO film 20 of, e.g., 3-9 atm %.

Then, the NH$_3$ processing of exposing the HfSiO film 20 to NH$_3$ gas is made to nitride the HfSiO film 20. The conditions of the NH$_3$ processing are, e.g., the processing temperature of 780° C., the NH$_3$ flow rate of 1 slm, the pressure of 100 Pa and the processing period of time of 10 minutes.

Thus, a HfSiON film 22 of the HfSiO film 20 nitrided by the NH$_3$ processing is formed (FIG. 8C). The nitrogen concentration of the HfSiON film 22 formed by the NH$_3$ processing is, e.g., 25 atm % or above.

Then, on the HfSiON film 22, a HfSiO film 24 of, e.g., an about 3 nm-thickness is deposited by CVD (FIG. 8D). The conditions for forming the HfSiO film 24 are, e.g., TDMAH, TDMAS, nitrogen monoxide gas and nitrogen gas of the carrier gas as the source gas, and the substrate temperature of 600° C. The nitrogen concentration of the HfSiO film 24 is, e.g., 10 atm % or below.

Next, the Al processing of adhering Al to the surface of the HfSiO film 24 is made. In the Al processing, for example, the gas of the liquid raw material of TTBA bubbled with 300 sccm of nitrogen gas at 20° C. and 50 kPa is sprayed to the surface of the HfSiO film 24. The period of time of the Al processing is, e.g., 15 seconds. The Al source used in the Al processing is not essentially TTBA and may be, e.g., trimethylaluminum (TMA: Al(CH$_3$)$_3$), triethylaluminum (TEA: Al(C$_2$H$_5$)$_3$) or others.

Figure 9A:
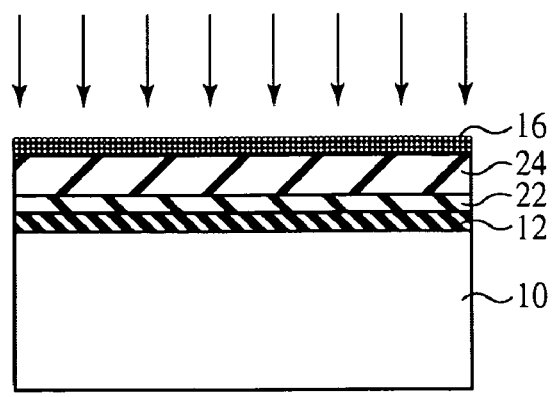

Thus, by the Al processing of spraying TTBA, an Al adhered layer 16 of the adhered Al is formed on the surface of the HfSiO film 24 (FIG. 9A). The thickness of the Al adhered layer 16 is, e.g., 0.1-1 nm. The Al adhering to the surface of the HfSiO film 24 is adhering often in a state of aluminum oxide (Al$_x$O$_y$). The Al adhered layer in the specification of the present application includes the layer with Al adhering in a state of in Al$_x$O$_y$.

Figure 9B:
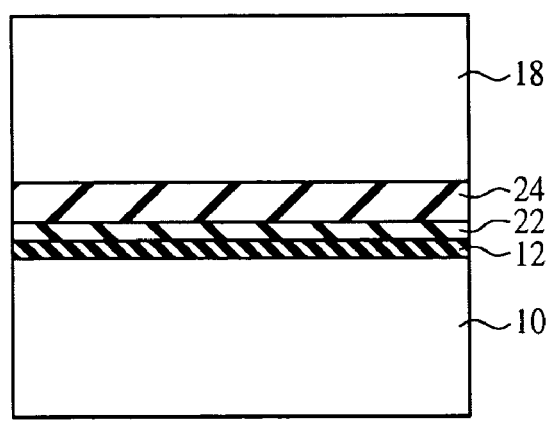

Then, on the HfSiO film 24 subjected to the Al processing, a polysilicon film 28 is deposited by CVD (FIG. 9B). Then, an impurity of a prescribed conduction type is ion-implanted into the polysilicon film 18.

Then, thermal processing of, e.g., 1050° C. of 1 second is made to activate the impurity ion implanted in the polysilicon film 18.

Figure 9C:
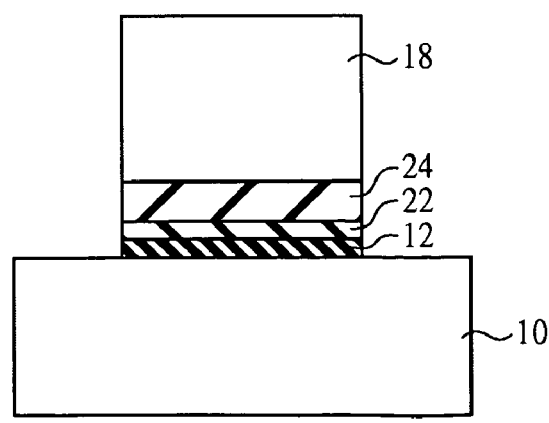

Next, by photolithography and etching, a MOS diode is formed (FIG. 9C).

Figure 10:
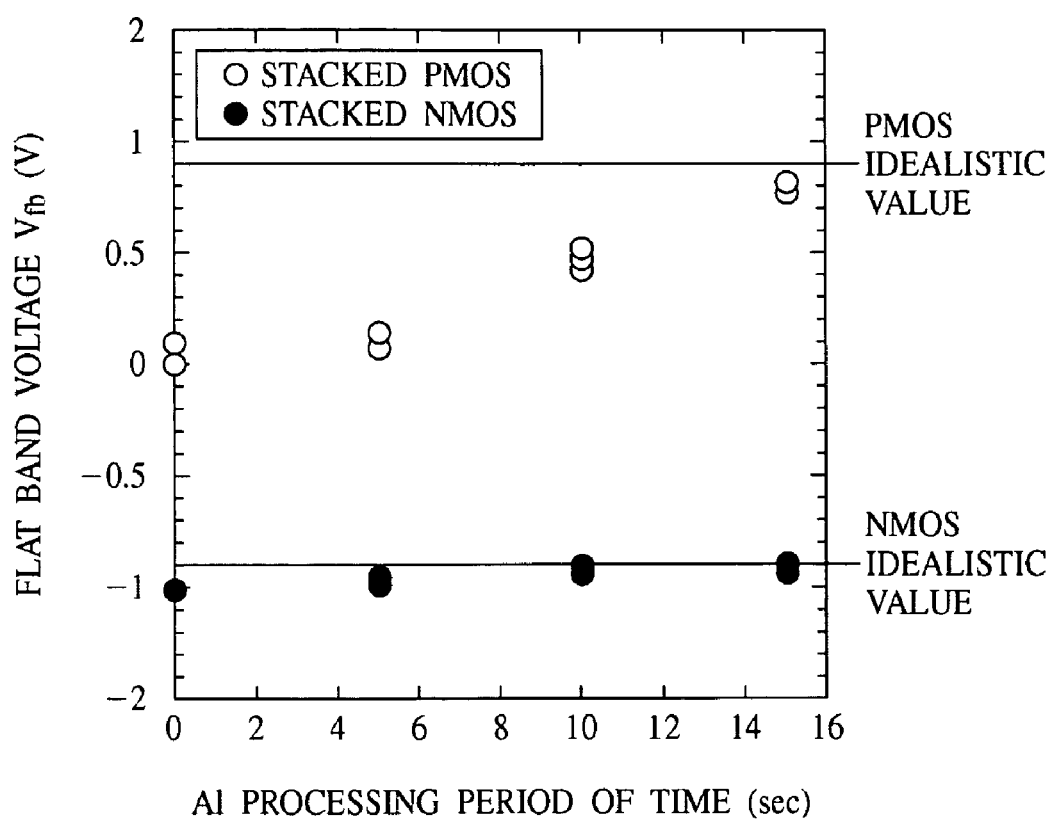
FIG. 10 is a graph of the flat band voltages $V_{fb}$ of the MOS diode having the stacked structure of the HfSiON film formed by the $NH_3$ processing and the HfSiO film subjected to the Al processing plotted for period of times of the Al processing.

FIG. 10 is the graph of the flat band voltages V$_{fb}$ of the stacked structure of the HfSiON film formed by the NH$_3$ processing and the HfSiO film subjected to the Al processing, which were plotted for the Al processing periods of time. On the horizontal axis of the graph, the Al processing period of time is taken, and the flat band voltage V$_{fb}$ is taken on the vertical axis.

As evident in the graph of FIG. 10, when the Al processing was made for 15 seconds, the generation of the Fermi level pinning can be suppressed, and the flat band voltage V$_{fb}$ can be controlled to be substantially the idealistic values.

Usually, after the HfSiON film has been formed, post deposition anneal is made in many cases for the purpose of densifying the film or others. However, in the present invention, preferably, the post deposition anneal after the formation of the HfSiON film is not made. This is because the nitrogen in the HfSiON film is diffused with the undesirable result that the effect of the Al processing may be suppressed. The HfSiON film and the HfSiO film are densified by heat to be applied in steps following the step of depositing the polysilicon film, and other steps.

Figure 11:
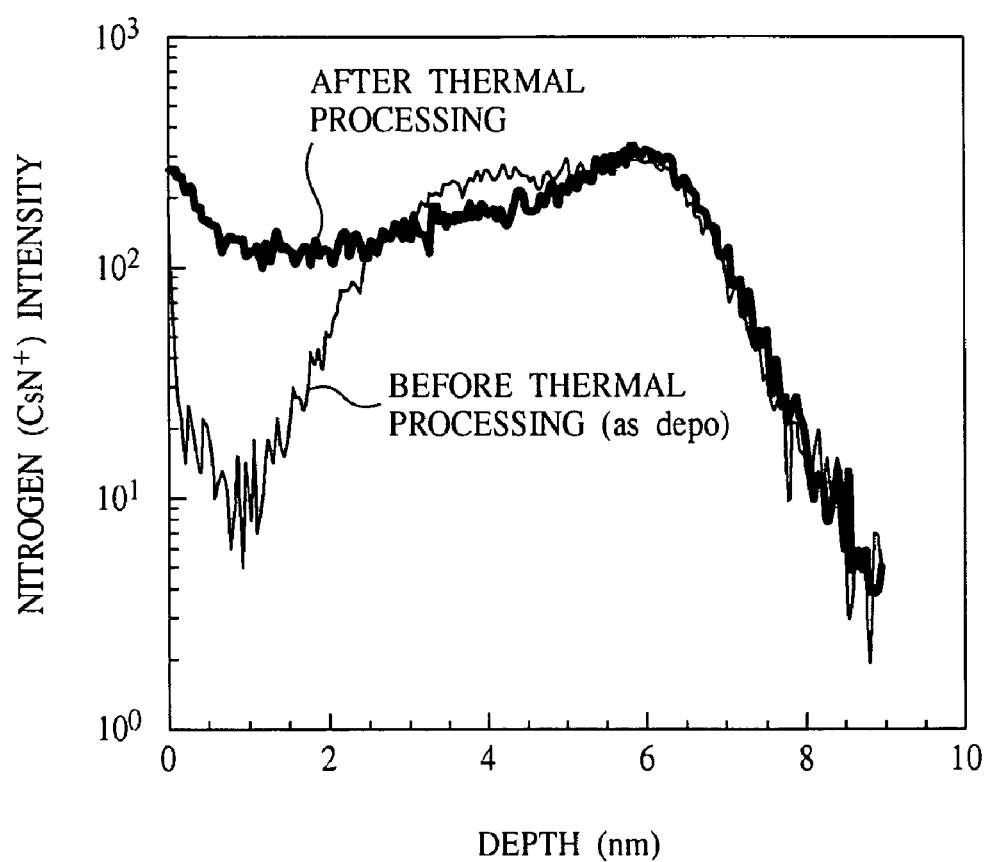
FIG. 11 is a graph of the result of analyzing by SIMS the depth-wise distribution of nitrogen before and after the thermal processing.

FIG. 11 is the graph of analyzing by SIMS (Secondary Ion Mass Spectrometry) the depth-wise distribution of nitrogen, before and after thermal processing of 800° C. and 3 seconds, of the stacked structure of a 4.5 nm-thickness HfSiON film and a 3 nm-thickness HfSiO film sequentially stacked on a silicon substrate. The depth from the surface of the HfSiO film is taken on the horizontal axis of the graph, and on the vertical axis, the nitrogen intensity is taken.

Based on the graph of FIG. 11, it is seen that the thermal processing diffuses the nitrogen in the HfSiON film into the HfSiO film.

When the nitrogen is thus diffused, the effect of the Al processing for suppressing the Fermi level pinning may suppressed. In the present invention, preferably, the post deposition anneal after the formation of the HfSiON film is not made.

In the present invention as well, the Al of the Al adhered layer formed by the Al processing on the surface of the HfSiO film is diffused into the HfSiO film, which is the underlying layer of the polysilicon film while the polysilicon film is being deposited on the HfSiO film.

Figure 12A:
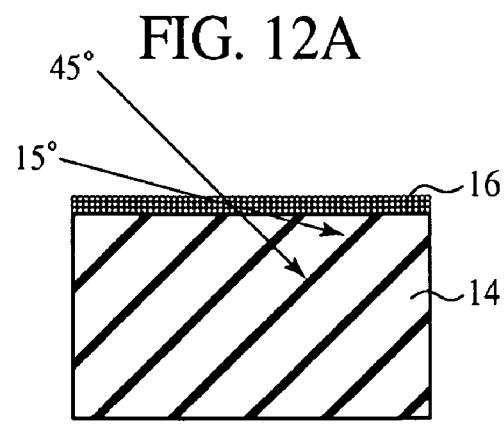
FIG. 12A is a sectional view showing the XPS measurement.
Figure 12B:
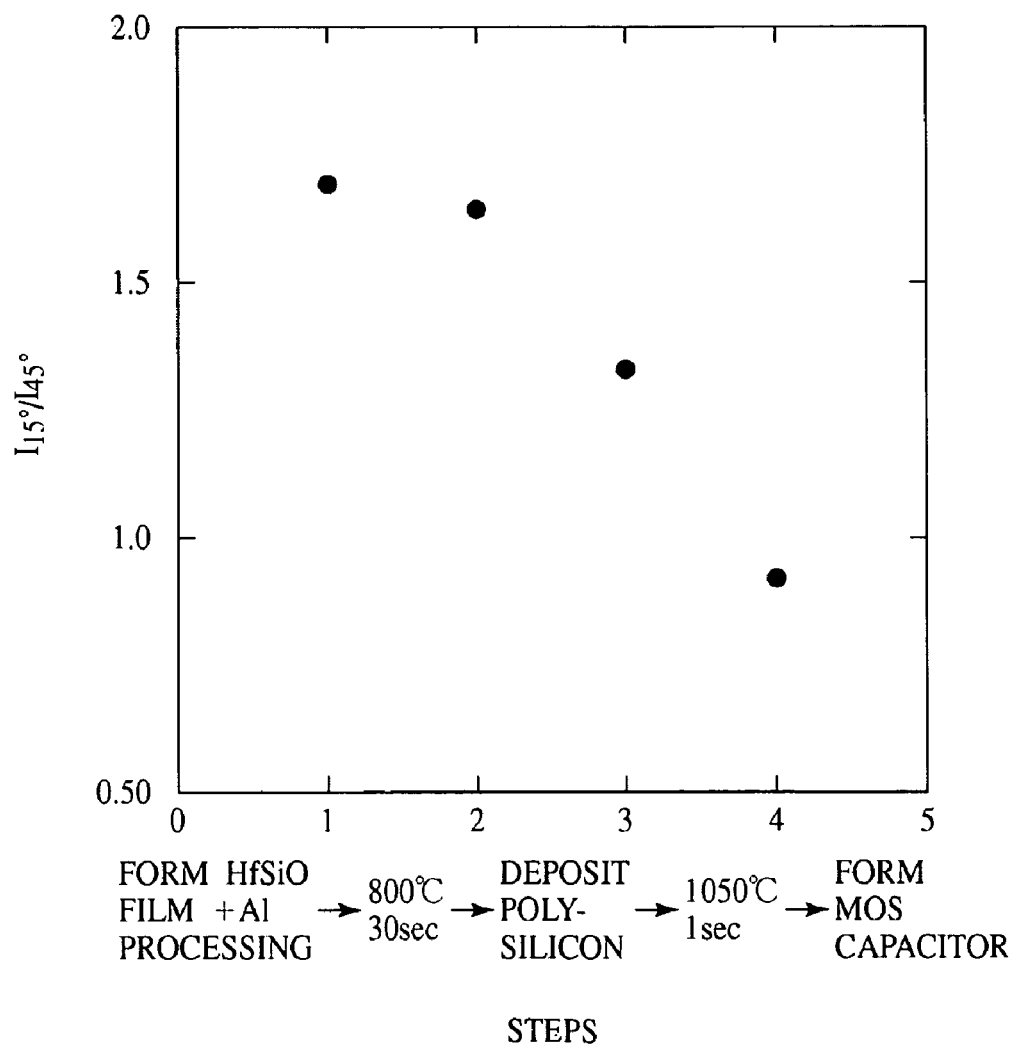
FIG. 12B is a graph of the result of analyzing by XPS the manners of the Al of the Al adhered layer on the surface of the HfSiO film going being diffused into the HfSiO film.

FIG. 12B is the graph of the result of analyzing by XPS (X-ray Photoelectron Spectroscopy) the manner of the Al of the Al adhered layer formed on the surface of the HfSiO film being diffused into the HfSiO film in the string of the steps illustrated in FIGS. 1A-1C and 2A-2B including the Al processing.

In the experiment, in each step after the Al processing, the present of Al on the surface of the HfSiO film after the step was completed was analyzed by XPS. As illustrated in FIG. 12A, the measurement by the XPS was made at the X-ray radiation angles of 45° and 15°, and the ratio $I_{15°}/I_{45°}$ of the Al intensity $I_{15°}$ at the radiation angle 15° to the Al intensity $I_{45°}$ at the radiation angle 45° was calculated. The $I_{15°}/I_{45°}$ being larger than 1 means that the Al quantity present on the surface of the HfSiON film 14 is larger, and the $I_{15°}/I_{45°}$ being smaller than 1 means that the Al quantity diffused into the HfSiO film 14 is larger. The $I_{15°}/I_{45°}$ is taken on the vertical axis of the graph of FIG. 12B.

The "1" to "5" on the horizontal axis of the graph of FIG. 12B indicates the time points of the string of steps illustrated in FIGS. 1A-1C and 2A-2B. "0" indicates the time point after the completion of the pre-processing illustrated in FIG. 1A. In the duration of "0" to "1", the formation of HfSiO film illustrated in FIG. 1B and the Al processing illustrated in FIG. 1C were made, and "1" indicates the time point of the completion of the Al processing. The temperature of forming the HfSiO film was 600° C., and the film forming period of time was about 7 minutes. In the duration of "1" to "2", thermal processing of 800° C. and 30 seconds was made, and "2" indicates the time point of the completion of the thermal processing. In the duration of "2" to "3", the deposition of the polysilicon film illustrated in FIG. 2A was made, and "3" indicates the time point after 20 minutes from the completion of the deposition of the polysilicon film. The deposition of the polysilicon film was made at the substrate temperature of 620° C. and for about 11 minutes of film forming period of time. For 30 minutes before the deposition of the polysilicon film, the substrate was only heated. In the duration of "3" to "4", thermal processing of 1050° C. and 1 second was made, and "4" indicates the time point after the completion of the thermal processing. In the duration of "4" to "5", the MOS capacitor (MOS diode) was formed, and "5" indicates the tine time point of the completion of the MOS capacitor formation.

As evident in the graph of FIG. 12B, the Al on the surface of the HfSiO film goes on being diffused into the HfSiO film when the polysilicon film is deposited, and the diffusion is further advanced by the following thermal processing.

As described above, in the present invention, when the polysilicon film is deposited, Al is diffused into the HfSiO(N)

film. Accordingly, the HfSiO(N) film subjected to the Al processing contains Al in the formed MOS structure.

The semiconductor device and the method of manufacturing the same according to the present invention will be specifically explained below.

A First Embodiment

The semiconductor device and the method of manufacturing the same according to a first embodiment of the present invention will be explained with reference to FIGS. 13 to 18B. FIG. 13 is a diagrammatic sectional view showing the structure of the semiconductor device according to the present embodiment. FIGS. 14A to 18B are sectional views showing the method of manufacturing the semiconductor device according to the present embodiment.

First, the structure of the semiconductor device according to the present embodiment will be explained with reference to FIG. 13. In the present embodiment, the present invention is applied to the NMOS transistor.

A p-type well 28 is formed in a p-type silicon substrate 26.

On the silicon substrate 26, a gate insulating film 34 of an interface layer 30 of a silicon oxide film and an Hf-based high dielectric constant insulating film 32 laid the latter on the former is formed. In the specification of the present application, the high dielectric constant insulating film means an insulating film whose dielectric constant is higher than silicon oxide film.

The Hf-based high dielectric constant insulating film 32 has the stacked structure of a nitrided hafnium silicate (HfSiON) film 38 and a hafnium silicate (HfSiO) film 40 laid the latter on the former.

As will be described alter, the HfSiON film 38 is formed by nitriding a HfSiO film by the $NH_3$ processing of exposing the HfSiO film to $NH_3$ gas. The nitrogen concentration of the HfSiON film 38 is, e.g., 25 atm % or above.

The HfSiO film 40 contains Al. As will be described later, the Al contained in the HfSiO film 40 is the Al adhered to the surface of the HfSiO film 40 by the Al processing of spraying an organic aluminum compound, which has been diffused in the HfSiO film 40 when polysilicon film to be the gate electrode 42n was deposited. The HfSiO film 40 does not essentially have the nitrogen concentration of zero and may contain nitrogen. When the HfSiO film 40 contains nitrogen, the nitrogen concentration of the HfSiO film 40 is lower than the nitrogen concentration of the HfSiON film 38. That is, the relationship $0 \leq y < x$ holds when the nitrogen concentration of the HfSiON film 38 is x, and the nitrogen concentration of the HfSiO film 40 is y.

On the gate insulating film 34, a gate electrode 42n of a polysilicon film is formed.

On the side walls of the gate electrode 42n and the gate insulating film 34, a sidewall insulating film 44 is formed.

In the substrate 26 on both sides of the gate electrode 42n, shallow n-type impurity diffused regions 46n forming the extension regions of the extension source/drain structure are formed by self-alignment with the gate electrode 42n. Furthermore, deep n-type impurity diffused regions 48n which is deeper than the impurity diffused regions 46n are formed by self-alignment with the sidewall insulating film 44 and the gate electrode 42n. These impurity diffused regions 46n, 48n form the source/drain diffused layers 50n of the extension source/drain structure. Between the source/drain diffused layers is a p-type channel region 52. P-type pocket regions 54p are formed on the sides of the source/drain diffused layers 50n nearer to the channel region 52.

Thus, an NMOS transistor 56n including the gate electrode 42n and the source/drain diffused layers 50n with the gate insulating film 34 including the Hf-based high dielectric constant insulating film 32 is formed.

The semiconductor device according to the present invention is characterized mainly in that the Hf-based high dielectric constant insulating film 32 used in the gate insulating film 34 has the stacked structure of the HfSiON film 38 and the HfSiON film 40, the HfSiON film 38 on the side of the silicon substrate 26 is formed by nitriding the HfSiO film by the $NH_3$ processing, and the HfSiO film 40 on the side of the gate electrode 42n of the polysilicon film contains Al adhered to the surface thereof by the Al processing, which is diffused thereinto when the polysilicon film to be the gate electrode 42n is deposited.

The HfSiON film 40 on the side of the gate electrode 42n of the polysilicon film contains Al adhered to the surface thereof by the Al processing, which is diffused thereinto when the polysilicon film to be the gate electrode 42n is deposited, whereby the generation of the Fermi level pinning can be suppressed.

The HfSiON film 38 on the side of the silicon substrate 26 is formed by nitriding the HfSiO film by the $NH_3$ processing, whereby the shift of the flat band voltage $V_{fb}$ can be suppressed, and the flat band voltage $V_{fb}$ can be controlled to be the idealistic value given in the case a silicon oxide film is used as the gate insulating film. The HfSiO film 40 on the side of the gate electrode 42n is not subjected to the $NH_3$ processing, which does not impair the effect of suppressing the generation of the Fermi level pinning.

As described above, the semiconductor device according to the present embodiment can suppress the generation of the Fermi level pinning of the NMOS transistor 56n, suppress the shift of the flat band voltage $V_{fb}$ thereof and can control the flat band voltage $V_{fb}$ thereof to be the idealistic value, whereby the electric characteristics can be improved.

Next, the method for manufacturing the semiconductor device according to the present embodiment will be explained with reference to FIGS. 14A to 18B.

First, on the p-type silicon substrate 26 whose primary surface is (100) face, a device isolation region (not illustrated) is formed by, e.g., STI (Shallow Trench Isolation) to define an active region.

Figure 14A:
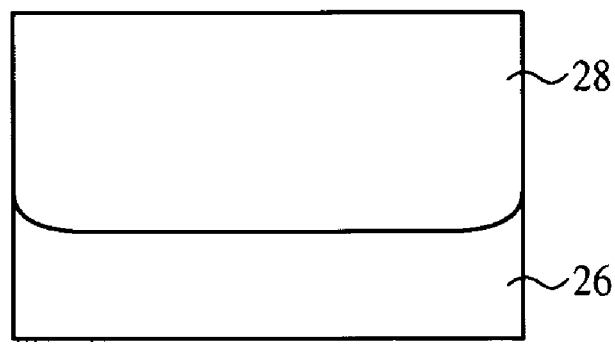
FIGS. 14A-14C, 15A-15C, 16A-16B, 17A-17B and 18A-18B are sectional views showing the method of manufacturing the semiconductor device according to the first embodiment of the present invention.

Next, by, e.g., ion implantation, a p-type impurity is implanted in the silicon substrate 26 to form the p-type well 28 (FIG. 14A).

Figure 14B:
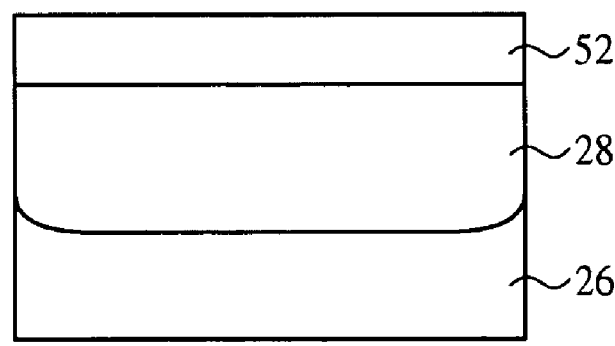

Then, by, e.g., ion implantation, a p-type impurity is implanted into the channel region 52 in the silicon substrate 26 (FIG. 14B).

Next, the natural oxide film on the surface of the silicon substrate 26 is removed with diluted fluoric acid.

Figure 14C:
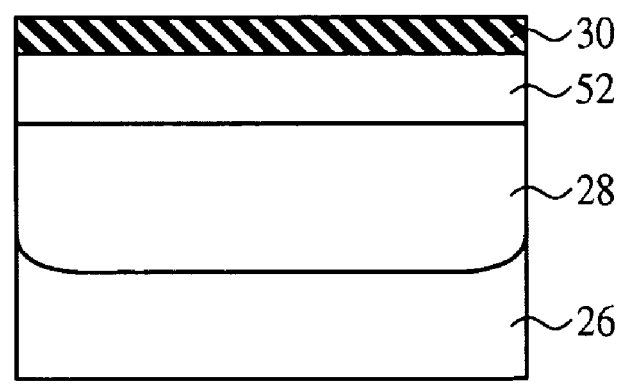

Next, the surface of the silicon substrate 26 is oxidized by the processing using, e.g., a chemical liquid of mixed hydrochloric acid and hydrogen peroxide. Thus, on the surface of the silicon substrate 26, the interface layer 30 of, e.g., a 1 nm-thickness silicon oxide film is formed (FIG. 14C). The interface layer 30 is formed for chemically and electrically stabilizing the interface between the silicon substrate 26 and the film to be formed on the silicon substrate 26. As the interface layer 30, a silicon oxynitride film (SiON film) may be formed.

Figure 15A:
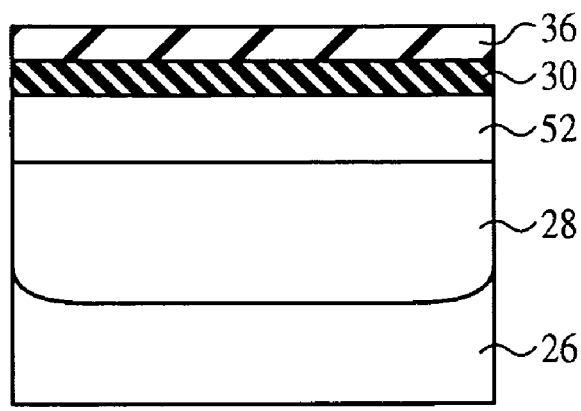

Then, on the interface layer 30, the HfSiO film 36 of, e.g., a 1 nm-thickness is deposited by, e.g., CVD (FIG. 15A). The conditions for forming the HfSiO film 36 are, e.g., TDMAH, TDMAS, oxygen gas and nitrogen gas of the career gas as the source gas, and the substrate temperature of 600° C. The nitrogen concentration of the HfSiO film 36 is, e.g., 10 atm % or below.

Then, the NH$_3$ processing of exposing the HfSiO film 36 to NH$_3$ gas is made to nitride the HfSiO film 36. The conditions for the NH$_3$ processing are, e.g., the processing temperature of 780° C., the NH$_3$ flow rate of 2 slm, the pressure of 100 Pa and the processing period of time of 10 minutes.

Figure 15B:
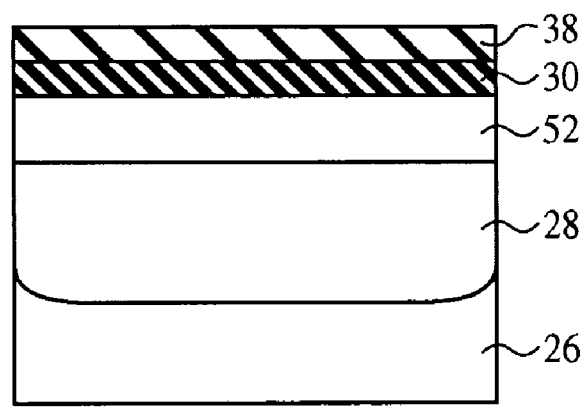

The HfSiO film 36 is thus nitrided by the NH$_3$ processing to form the HfSiON film 38 (FIG. 15B). The nitrogen concentration of the HfSiON film 38 formed by the NH$_3$ processing is, e.g., 25 atm % or above.

Figure 15C:
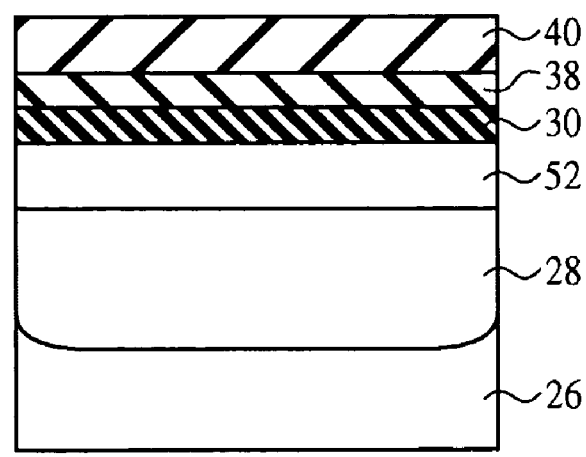

Then, on the HfSiON film 38, the HfSiO film 40 of, e.g., a 3 nm-thickness is deposited by, e.g., CVD (FIG. 15C). The conditions for forming the HfSiO film 40 are, e.g., TDMAH, TDMAS, oxygen gas and nitrogen gas of the carrier gas as the source gas, and the substrate temperature of 600° C. The nitrogen concentration of the HfSiO film 40 is lower than the nitrogen concentration of the HfSiON film 38, e.g., 10 atm % or below.

It is preferable that the post deposition anneal for densifying the HfSiON film 38 and the HfSiO film 40 is not made after the HfSiO film 40 has been formed and before the polysilicon film 42 is formed. This is because the nitrogen in the film of the HfSiON film 38 is diffused into the film of the HfSiO film 40.

Then, the Al processing of adhering Al to the surface of the HfSiO film 40 is made. In the Al processing, for example, the gas of the liquid raw material of TTBA bubbled with 300 sccm nitrogen gas under the conditions of 20° C. and 50 kPa is sprayed to the surface of the HfSiO film 40 with the substrate temperature set at 600° C. The period of time of the Al processing is, e.g., 5-20 seconds, specifically 15 seconds.

Figure 16A:
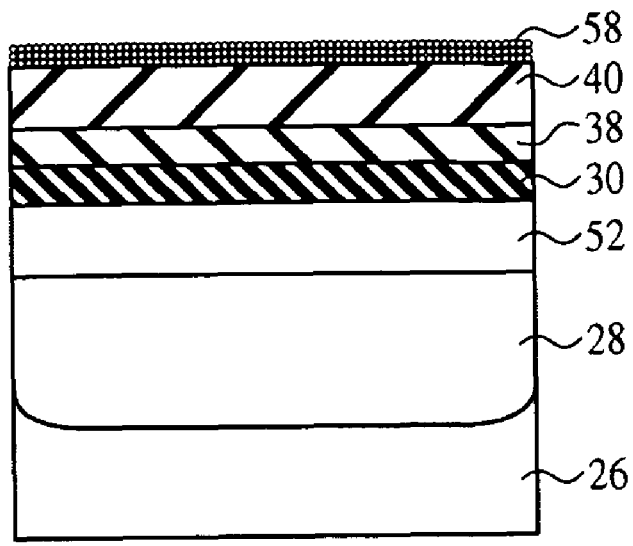

Thus, the Al adhered layer 58 of the Al adhered to the surface of the HfSiO film 40 by the Al processing of spraying TTBA is formed (FIG. 16A). The thickness of the Al adhered layer 58 is, e.g., 0.1-1 nm.

Figure 16B:
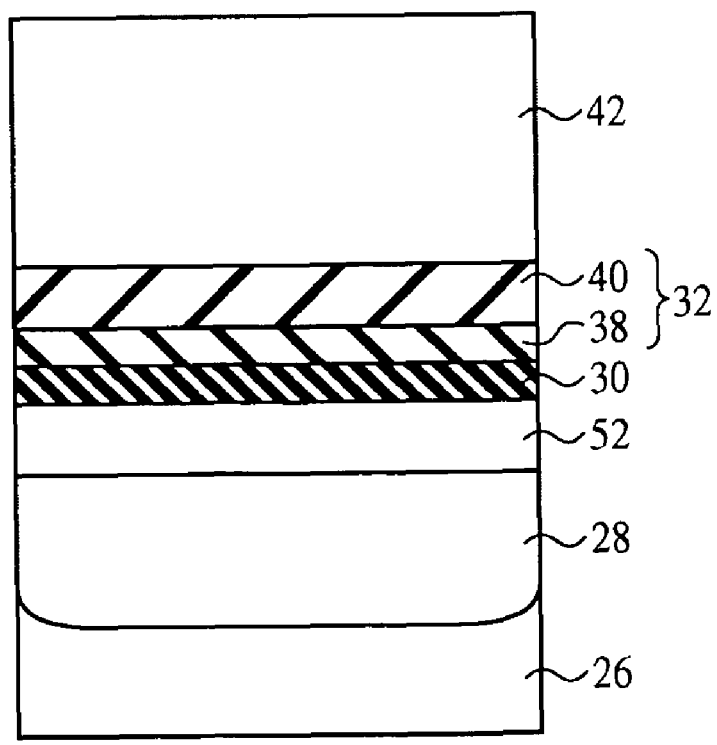

Next, on the HfSiO film 40 subjected to the Al processing, the polysilicon film 42 is deposited by, e.g., CVD (FIG. 16B). The conditions for forming the polysilicon film 42 are, e.g., monosilane (SiH$_4$) as the silicon raw material and the substrate temperature of 600° C.

In depositing the polysilicon film 42, the Al of the Al adhered layer 58 formed on the surface of the HfSiO film 40 goes on being diffused into the HfSiO film 40.

Thus, below the polysilicon film 42, the Hf-based high dielectric constant insulating film 32 of the stacked structure of the HfSiON film 38 formed by nitriding the HfSiO film 36 by the NH$_3$ processing, and the HfSiO film 40 with the Al adhered to the surface and diffused therein is formed.

Figure 17A:
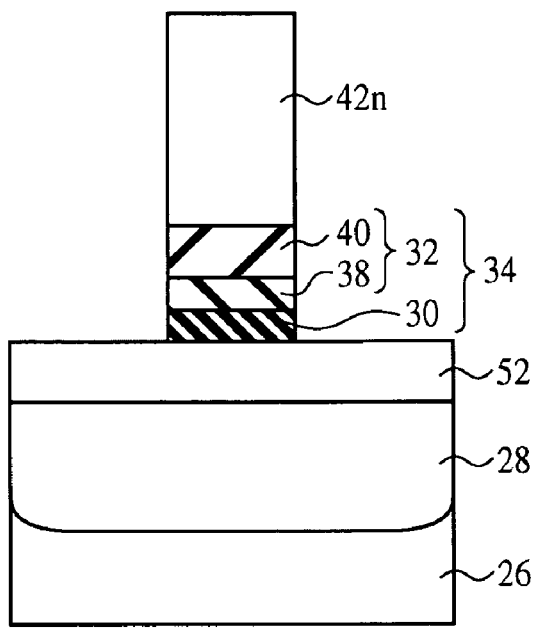

Next, by photolithography and etching, the polysilicon film 42 is patterned to form the gate electrode 42n of the polysilicon film (FIG. 17A). The Hf-based high dielectric constant insulating film 32 and the interface layer 30 on both sides of the gate electrode 42n are also etched.

Then, with the gate electrode 42n as the mask, ion implantation is made to form in the silicon substrate 26 by the self-alignment with the gate electrode 42n the n-type impurity diffused regions 46n forming the extension regions of the extension source/drain structure.

Figure 17B:
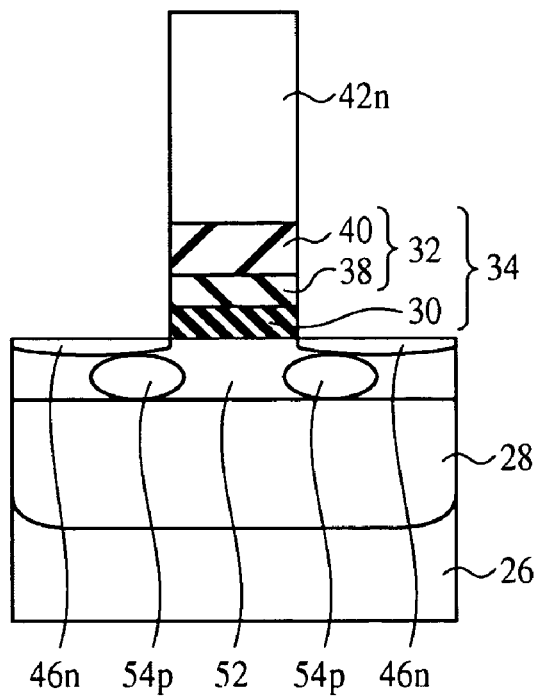

Next, by pocket ion implantation, the p-type pocket regions 54p are formed on the sides of the regions to be the source/drain diffused layers 50n nearer to the channel region 52 (FIG. 17B).

Figure 18A:
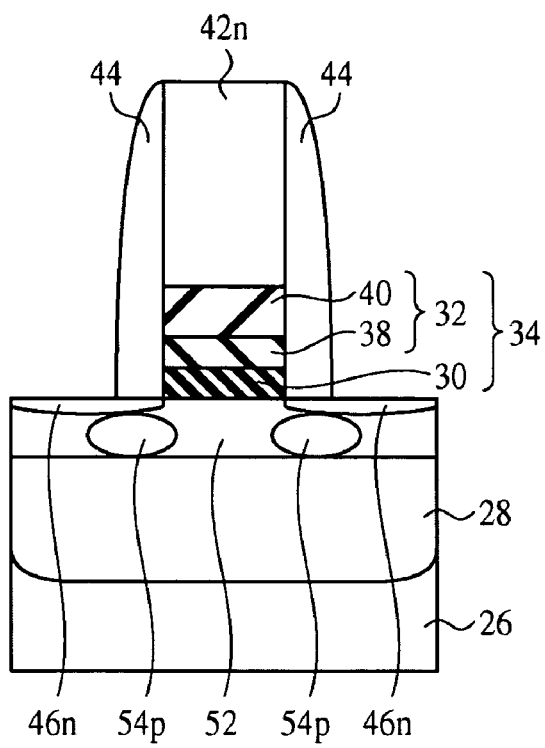

Next, a silicon oxide film, for example, is formed on the entire surface and then is isotropically etched. Thus, on the side walls of the gate electrode 42n and the gate insulating film 34, the sidewall insulating film 44 of the silicon oxide film is formed (FIG. 18A).

Next, with the sidewall insulating film 44 and the gate electrode 42n as the mask, ion implantation is made to form the n-type impurity diffused regions 48n which are deeper than the impurity diffused regions 46n by self-alignment with the sidewall insulating film 44 and the gate electrode 42n. By this ion implantation, the n-type impurity is implanted into the gate electrode 42n.

Figure 18B:
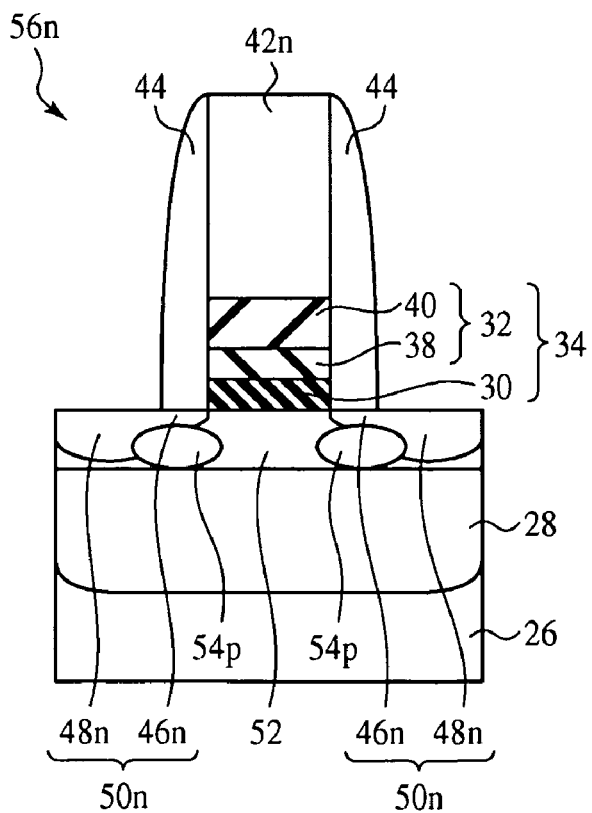

Thus, the source/drain diffused layers 50n of the extension source/drain structure formed of the impurity diffused regions 46n, 48n are formed (FIG. 18B).

Then, prescribed thermal processing is made to activate the impurity implanted by the ion implantation.

Thus, the semiconductor device according to the present embodiment illustrated in FIG. 13 is manufactured.

As described above, according to the present embodiment, the NH$_3$ processing of exposing the HfSiO film 36 formed on the silicon substrate 26 to NH$_3$ gas is made to form the HfSiON film 38, the HfSiO film 40 to be the underlying layer of the polysilicon film 42 is formed on the HfSiON film 38, and the Al processing of adhering Al to the surface of the HfSiO film 40 is made, whereby, for the NMOS transistor 56n, the generation of the Fermi level pinning can be suppressed, and the shift of the flat band voltage $V_{fb}$ can be suppressed to control the flat band voltage $V_{fb}$ at the idealistic value. Thus, the NMOS transistor 56n using the Hf-based high dielectric constant insulating film 32 in the gate insulating film 34 can have the electric characteristics improved.

In the above, the present invention is applied to the NMOS transistor but is applicable to the PMOS transistor as well.

A Second Embodiment

Figure 19:
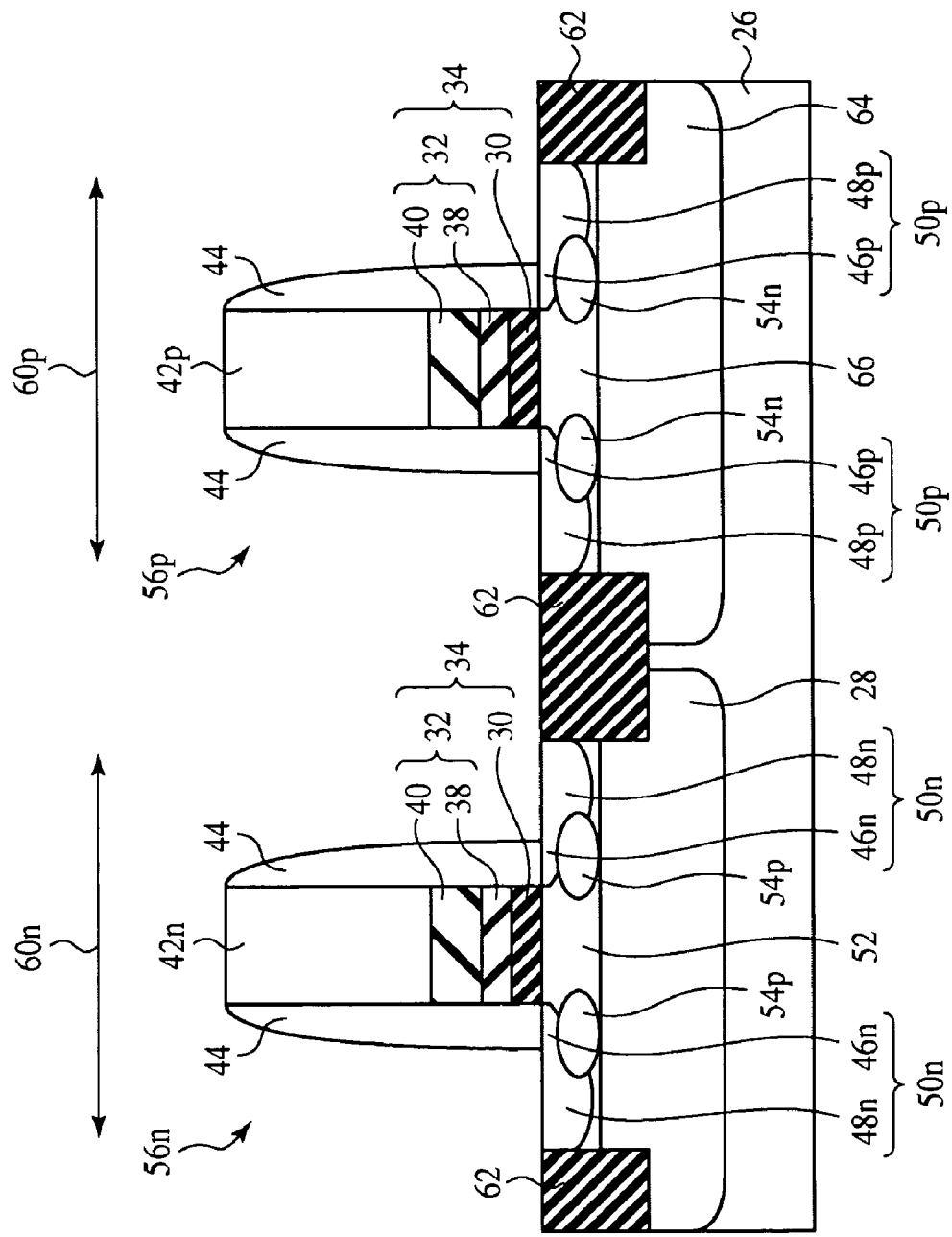
FIG. 19 is a diagrammatic sectional view showing the structure of the semiconductor device according to a second embodiment of the present invention.

The semiconductor device and the method of manufacturing the same according to a second embodiment of the present invention will be explained with reference to FIGS. 19 to 30. FIG. 19 is a diagrammatic sectional view of showing the structure of the semiconductor device according to the present embodiment. FIGS. 20 to 30 are sectional views showing the method of manufacturing the semiconductor device according to the present embodiment. The same members of the present embodiment as those of the semiconductor device and the method of manufacturing the semiconductor device according to the first embodiment are represented by the same reference numbers not to repeat or to simplify their explanation.

First, the structure of the semiconductor device according to the present embodiment will be explained with reference to FIG. 19.

The semiconductor device according to the present embodiment has a CMOS structure including an NMOS transistor and a PMOS transistor each using an Hf-based high dielectric constant insulating film 32 of the stacked structure of an HfSiON film 38 and an HfSiO film 40 in a gate insulating film 34, as does the semiconductor device according to the first embodiment.

As illustrated, on a silicon substrate 26, device isolation regions 62 for defining an NMOS transistor region 60n for an NMOS transistor 56n to be formed in and a PMOS transistor region 60p for a PMOS transistor 56p to be formed in are formed.

In the silicon substrate 26 in the NMOS transistor region 60n, a p-type well 28 is formed.

On the silicon substrate 26 with the p-type well 28 formed in, a gate insulating film 34 of an interface layer 30 of a silicon oxide film and a Hf-based high dielectric constant insulating film 32 laid the latter on the former is formed.

On the gate insulating film 34, a gate electrode 42*n* of a polysilicon film is formed.

On the side walls of the gate electrode 42*n* and the gate insulating film 34, a sidewall insulating film 44 is formed.

In the silicon substrate 26 on both sides of the gate electrode 42*n*, shallow n-type impurity diffused regions 46*n* forming the extension regions of the extension source/drain structure are formed by self-alignment with the gate electrode 42*n*. Furthermore, n-type impurity diffused regions 48*n* which are deeper than the impurity diffused regions 46*n* are formed by self-alignment with the sidewall insulating film 44 and the gate electrode 42*n*. These impurity diffused regions 46*n*, 48*n* form the source/drain diffused layers 50*n* of the extension source/drain structure. Between the source/drain diffused layers 50*n* is the p-type channel region 54*p*. P-type pocket regions 54*p* are formed on the sides of the source/drain diffused layers 50*n* nearer to the channel region 52.

Thus, in the NMOS transistor region 60*n*, the NMOS transistor 56*n* including the gate electrode 42*n* and the source/drain diffused layers 50*n* with the gate insulating film 34 including the Hf-based high dielectric constant insulating film 32 is formed.

In the silicon substrate 26 in the PMOS transistor region 60*p*, an n-type well 64 is formed.

On the silicon substrate 26 with the n-type well 64 formed in, the gate insulating film 34 of the interface layer 30 of a silicon oxide film and the Hf-based high dielectric constant insulating film 32 laid the latter on the former is formed.

On the gate insulating film 34, a gate electrode 42*p* of a polysilicon film is formed.

On the side walls of the gate electrode 42*p* and the gate insulating film 34, the sidewall insulating film 44 is formed.

In the silicon substrate 26 on both sides of the gate electrode 42*p*, shallow p-type impurity diffused regions 46*p* forming the extension regions of the extension source/drain structure are formed by self-alignment with the gate electrode 42*p*. Furthermore, p-type impurity diffused regions 48*p* which are deeper than the impurity diffused regions 46*p* are formed by self-alignment with the sidewall insulating film 44 and the gate electrode 42*p*. These impurity diffused regions 46*p*, 48*p* form the source/drain diffused layers 50*p* of the extension source/drain structure. Between the source/drain diffused layers 50*p* is an n-type channel region 66. N-type pocket regions 54*n* are formed on the sides of the source/drain diffused layers 50*p* nearer to the channel region 66.

Thus, in the PMOS transistor region 60*p*, a PMOS transistor 56*p* including the gate electrode 42*p* and the source/drain diffused layer 50*p* with the gate insulating film 34 including the Hf-based high dielectric constant insulating film 32 is formed.

As described above, the NMOS transistor 56*n* and the PMOS transistor 56*p* formed on the silicon substrate 26 form the CMOS structure.

The Hf-based high dielectric constant insulating film 32 used in the gate insulating film 34 of the NMOS transistor 56*n* and the PMOS transistor 56*p* forming the CMOS structure has the stacked structure of the HfSiON film 38 and the HfSiO film 40 laid the latter on the former, as in the semiconductor device according to the first embodiment.

The HfSiON film 38 is formed by nitriding the HfSiO film by the NH$_3$ processing of exposing the HfSiO film to NH$_3$ gas, as in the semiconductor device according to the first embodiment. The nitrogen concentration of the HfSiON film 38 is, e.g., 25 atm % or above.

As in the semiconductor device according to the first embodiment, the HfSiO film 40 contains Al, and the Al is Al adhered to the surface of the HfSiO film 40 by the Al processing of spraying an organic aluminum compound, which has been diffused in the HfSiO film 40 when the polysilicon film to be the gate electrodes 42*n*, 42*p* was deposited. The HfSiO film 40 does not essentially need to have the nitrogen concentration of zero and may contain nitrogen. When the HfSiO film 40 contains nitrogen, the nitrogen concentration of the HfSiO film 40 is lower than the nitrogen concentration of the HfSiON film 38. That is, the relationship $0 \leq y < x$ holds when the nitrogen concentration of the HfSiON film 38 is x, and the nitrogen concentration of the HfSiO film 40 is y.

The semiconductor device according to the present embodiment is characterized mainly in that in both the NMOS transistor 56*n* and the PMOS transistor 56*p* forming the CMOS structure, as in the first embodiment, the Hf-based high dielectric constant insulating film 32 used in the gate insulating film 34 has the stacked structure of the HfSiON film 38 and the HfSiON film 40, the HfSiON film 38 on the side of the silicon substrate 26 is formed by nitriding the HfSiO film by the NH$_3$ processing, and the HfSiO film 40 on the sides of the gate electrodes 42*n*, 42*p* of the polysilicon film contains Al adhered to the surface of the HfSiO film 40 by the Al processing and diffused into the HfSiO film 40 when the polysilicon film to be the gate electrodes 42*n*, 42*p* were deposited.

The HfSiO film 40 on the sides of the gate electrodes 42*n*, 42*p* of the polysilicon film contains Al adhered to the surface by the Al processing and diffused into the HfSiO film 40 when the polysilicon film to be the gate electrode 42*n* was deposited, whereby the generation of the Fermi level pinning can be suppressed respectively for both the NMOS transistor 56*n* and the PMOS transistor 56*p*.

The HfSiON film 38 on the side of the silicon substrate 10 is formed by nitriding the HfSiO film by the NH$_3$ processing, whereby for both the NMOS transistor 56*n* and the PMOS transistor 56*p*, the shift of the flat band voltage $V_{fb}$ can be suppressed, and the flat band voltage $V_{fb}$ can be controlled to be the idealistic value given by using a silicon oxide film as the gate insulating film. The HfSiO film 40 on the sides of the gate electrodes 42*n*, 42*p* are not subjected to the NH$_3$ processing, which does not impair the effect of suppressing the generation of the Fermi level pinning.

As described above, the semiconductor device according to the present embodiment, for both the NMOS transistor 56*n* and the PMOS transistor 56*p* forming the CMOS structure, the generation of Fermi level pinning can be suppressed, and the shift of the flat band voltage $V_{fb}$ can be suppressed to control the flat band voltage $V_{fb}$ to be the idealistic value, whereby good electric characteristics can be realized.

Next, the method of manufacturing the semiconductor device according to the present embodiment will be explained with reference to FIGS. 20A to 30.

First, on the silicon substrate 26, the device isolating film 52 of a silicon oxide film is formed by, e.g., the usual STI to define the NMOS transistor region 60*n* and the PMOS transistor region 60*p*.

Next, by photolithography, a photoresist film (not illustrated) exposing the NMOS transistor region 60*n* and covering the PMOS transistor region 60*p* is formed.

Next, with the photoresist film as the mask, a p-type impurity is implanted into the silicon substrate 26 by, e.g., ion implantation to form the p-type well 28.

Subsequently, by, e.g., ion implantation, a p-type impurity is implanted into the channel region 52 in the silicon substrate 26.

After the well implantation and the channel implantation in the NMOS transistor region 60n has been thus made, the photoresist film used as the mask is removed.

Next, by photolithography, a photoresist film (not illustrated) exposing the PMOS transistor region 60p and covering the NMOS transistor region 60n is formed.

Next, with the photoresist film as the mask, an n-type impurity is implanted into the silicon substrate 26 by, e.g., ion implantation to form the n-type well 64.

Subsequently, an n-type impurity is implanted into the channel region 66 in the silicon substrate 26 by, e.g., ion implantation.

Figure 20A:
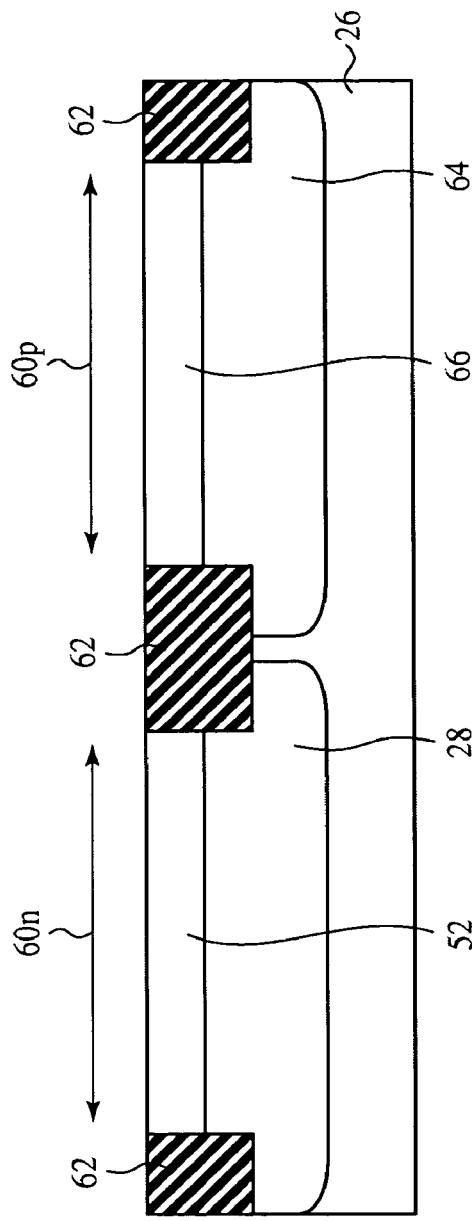

After the well implantation and the channel implantation in the PMOS transistor region 60p have been thus made, the photoresist film used as the mask is removed (FIG. 20A).

Next, the natural oxide film on the surface of the silicon substrate 26 is removed with diluted hydrofluoric acid.

Figure 20B:
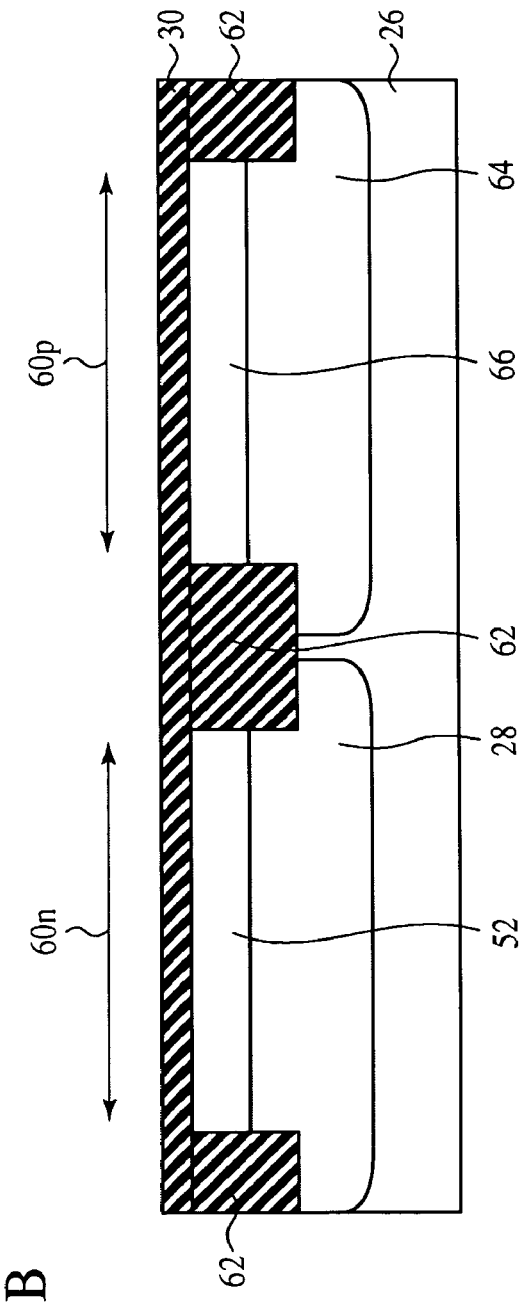

Then, the surface of the silicon substrate 26 is oxidized by the processing using, e.g., a chemical liquid of mixed hydrochloric acid and hydrogen peroxide. Thus, the interface layer 30 of a silicon oxide film of, e.g., a 1 nm-thickness is formed on the surface of the silicon substrate 26 (FIG. 20B).

Then, on the interface layer 30, the HfSiO film 36 of, e.g., a 1 nm-thickness is deposited by, e.g., CVD (FIG. 21A). The conditions for forming the HfSiO film 36 are, e.g., TDMAH, TDMAS, oxygen gas and nitrogen gas of the carrier gas as the source gas, and the substrate temperature of 600° C. The nitrogen concentration of the HfSiO film 36 is, e.g., 10 atm % or below.

Next, the $NH_3$ processing of exposing the HfSiO film 36 to $NH_3$ gas is made to nitride the HfSiO film 36. The conditions for the $NH_3$ processing are, e.g., the processing temperature of 780° C., the $NH_3$ flow rate of 2 slm, the pressure of 100 Pa, and the processing period of time of 10 minutes.

Thus, the HfSiON film 38 is formed by nitriding the HfSiO film 36 by the $NH_3$ processing (FIG. 21B). The nitrogen concentration of the HfSiON film 38 formed by the $NH_3$ processing is, e.g., 25 atm % or above.

Figure 22A:
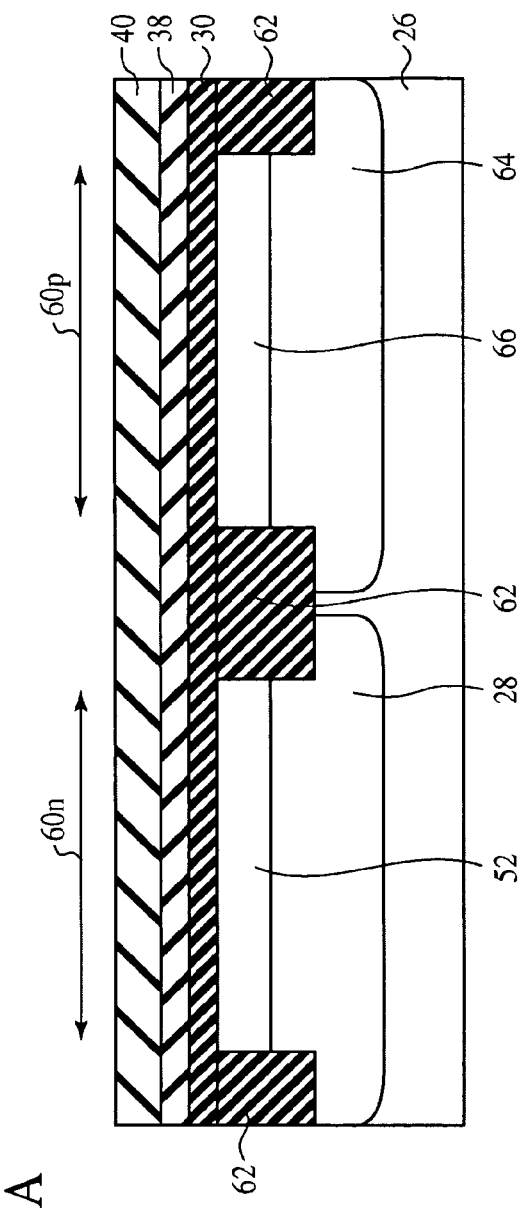

Next, on the HfSiON film 38, the HfSiO film 40 of, e.g., a 3 nm-thickness is deposited by, e.g., CVD (FIG. 22A). The conditions for forming the HfSiO film 40 are, e.g., TDMAH, TDMAS, oxygen gas and nitrogen gas of the carrier gas as the source gas, and the substrate temperature of 600° C. The nitrogen concentration of the HfSiO film 40 is lower than the nitrogen concentration of the HfSiON film 38, e.g., 10 atm % or below.

Next, the Al processing for adhering Al to the surface of the HfSiO film 40 is made. In the Al processing, for example, the gas of the liquid raw material of TTBA bubbled with 300 sccm nitrogen gas under 20° C. and 50 kPa is sprayed to the surface of the HfSiO film 40 with the substrate temperature set at 600° C. The period time of the Al processing is, e.g., 5-20 seconds, specifically 15 seconds.

Figure 22B:
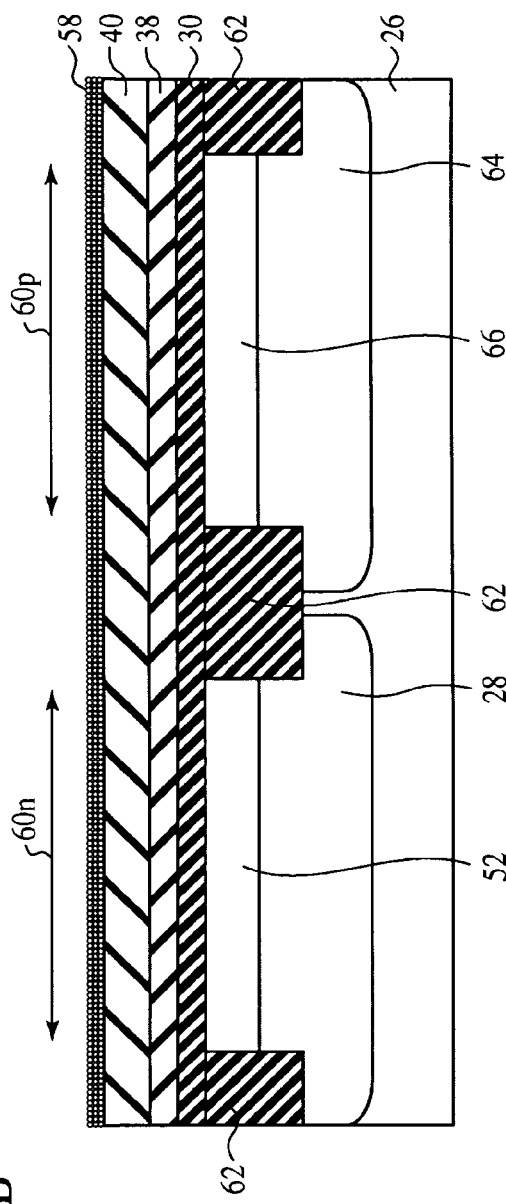

Thus, by the Al processing of spraying TTBA, the Al adhered layer 58 of the adhered Al is formed on the surface of the HfSiO film 40 (FIG. 22B). The thickness of the Al adhered layer 58 is, e.g., 0.1-1 nm.

Next, on the HfSiO film 40 subjected to the Al processing, the polysilicon film 42 is deposited by, e.g., CVD (FIG. 23). The conditions for forming the polysilicon film 42 are, e.g., $SiH_4$ as the silicon raw material and the substrate temperature of 600° C.

When the polysilicon film 45 is deposited, the Al of the Al adhered layer 58 formed on the HfSiO film 40 goes on being diffused into the HfSiO film 40.

Thus, below the polysilicon film 42, the Hf-based high dielectric constant insulating film 32 of the stacked structure of the HfSiON film 38 formed by nitriding the HfSiO film 36 by the $NH_3$ processing, and the HfSiO film 40 having the Al adhered to the surface diffused therein.

Next, by photolithograph and etching, the polysilicon film 42 is patterned to form the gate electrodes 42n, 42p of the polysilicon film (FIG. 24). At this time, the Hf-based high dielectric constant insulating film 32 and the interface layer 30 on both sides of the gate electrodes 42n, 42p are also etched.

Next, by photolithography, a photoresist film 68 exposing the PMOS transistor region 60p and covering the NMOS transistor region 60n is formed.

Next, with the photoresist film 68 and the gate electrode 42p as the mask, ion implantation is made to form the shallow p-type impurity diffused regions 46p forming the extension regions of the extension source/drain structure in the silicon substrate 26 by self-alignment with the gate electrode 42p.

Figure 25:
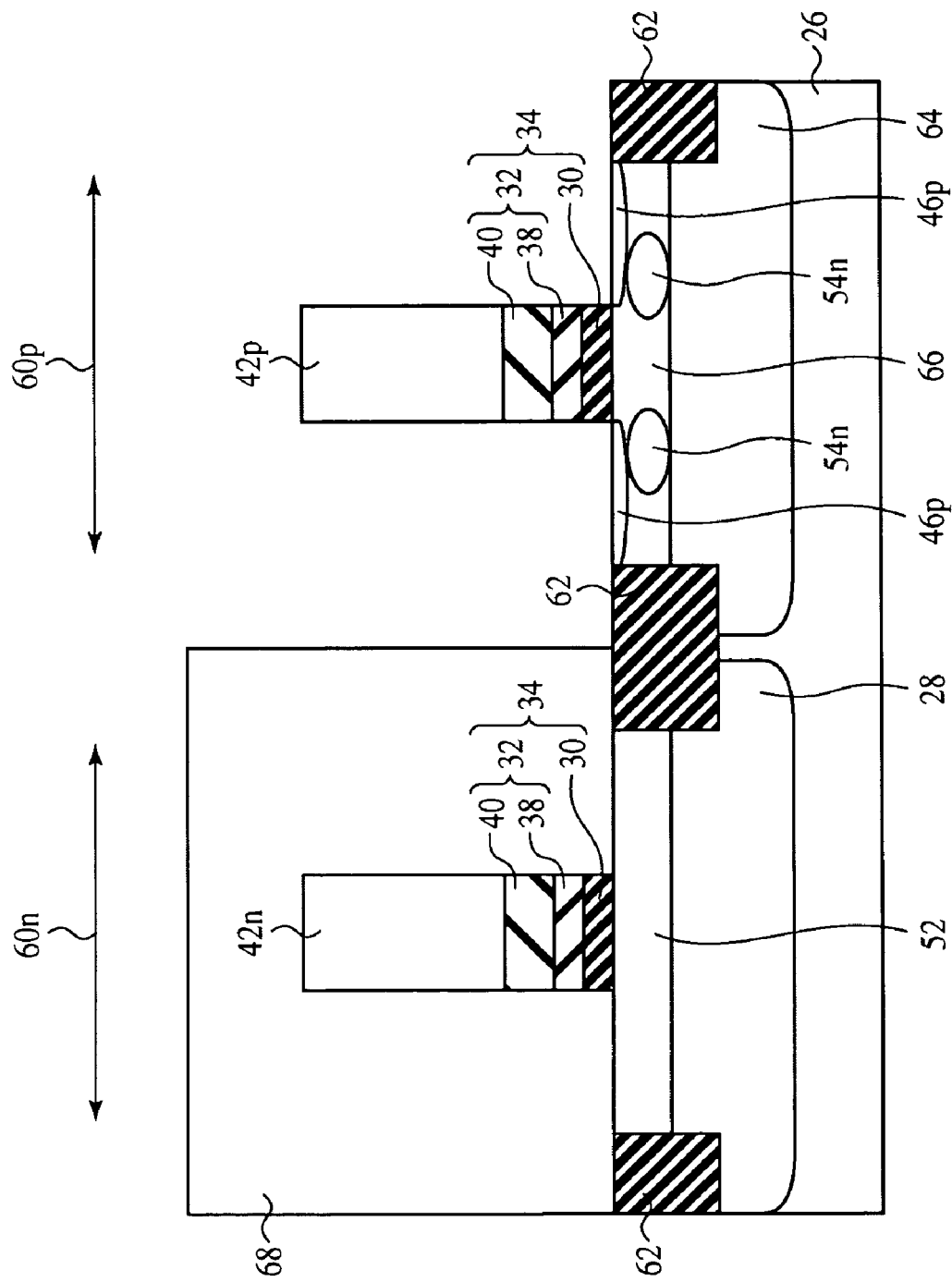

Next, pocket ion implantation is made to form the n-type pocket regions 45n on the sides of the regions to be the source/drain diffused layer 50p nearer to the channel region 66 (FIG. 25).

After the ion implantation has been thus made in the PMOS transistor region 60p, the photoresist film 68 used as the mask is removed.

Next, by photolithography, a photoresist film 70 exposing the NMOS transistor region 60n and covering the PMOS transistor region 60p is formed.

Next, with the photoresist film 70 and the gate electrode 42n as the mask, ion implantation is made to form the shallow n-type impurity diffused regions 46n forming the extension regions of the extension source/drain structure in the silicon substrate 26 by self-alignment with the gate electrode 42n.

Figure 26:
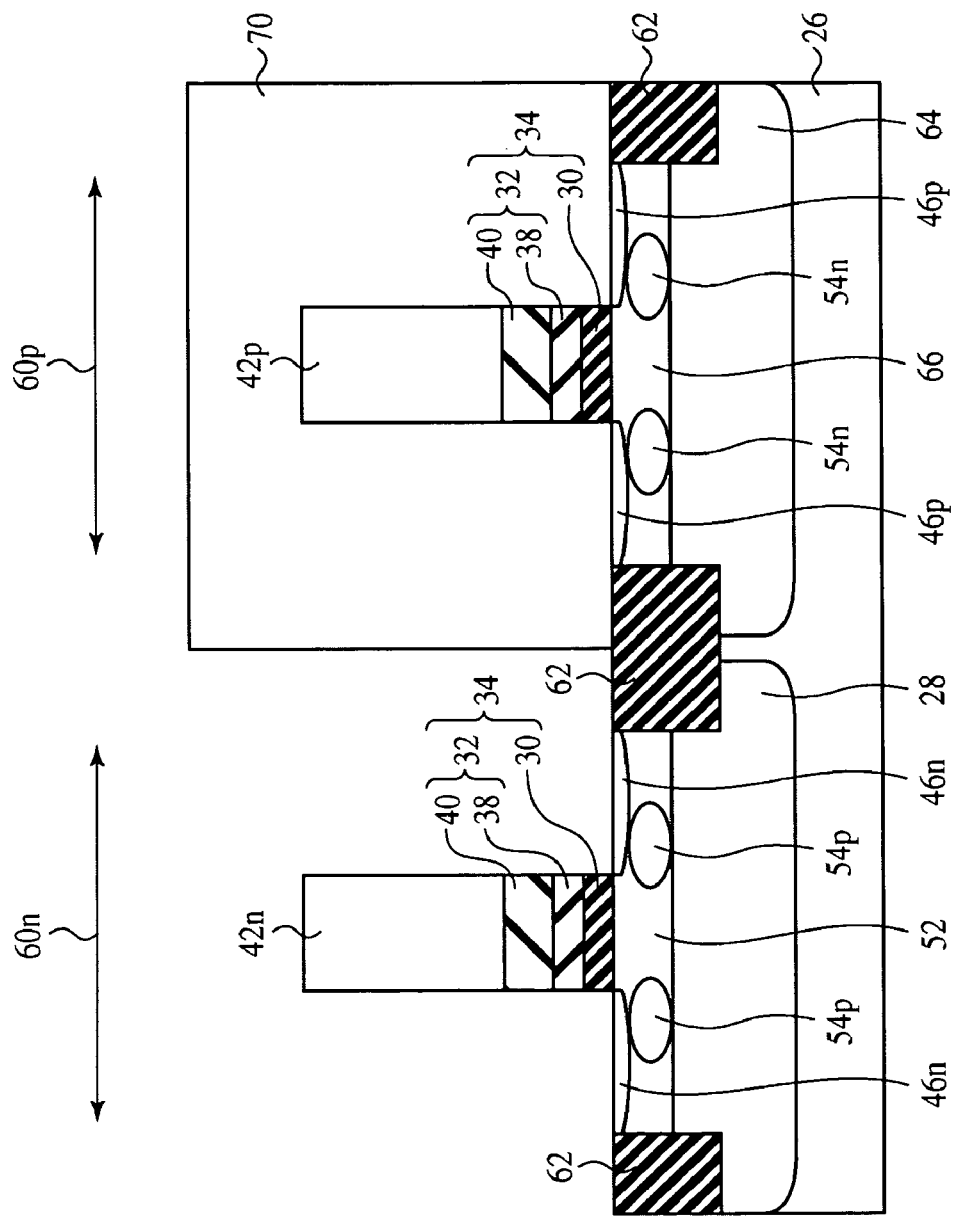

Then, pocket ion implantation is made to form the p-type pocket regions 54p on the sides of the regions to be the source/drain diffused layer 50n nearer to the channel region 52 (FIG. 26).

After the ion implantation has been thus made in the NMOS transistor region 60n, the photoresist film 70 used as the mask is removed.

Figure 27:
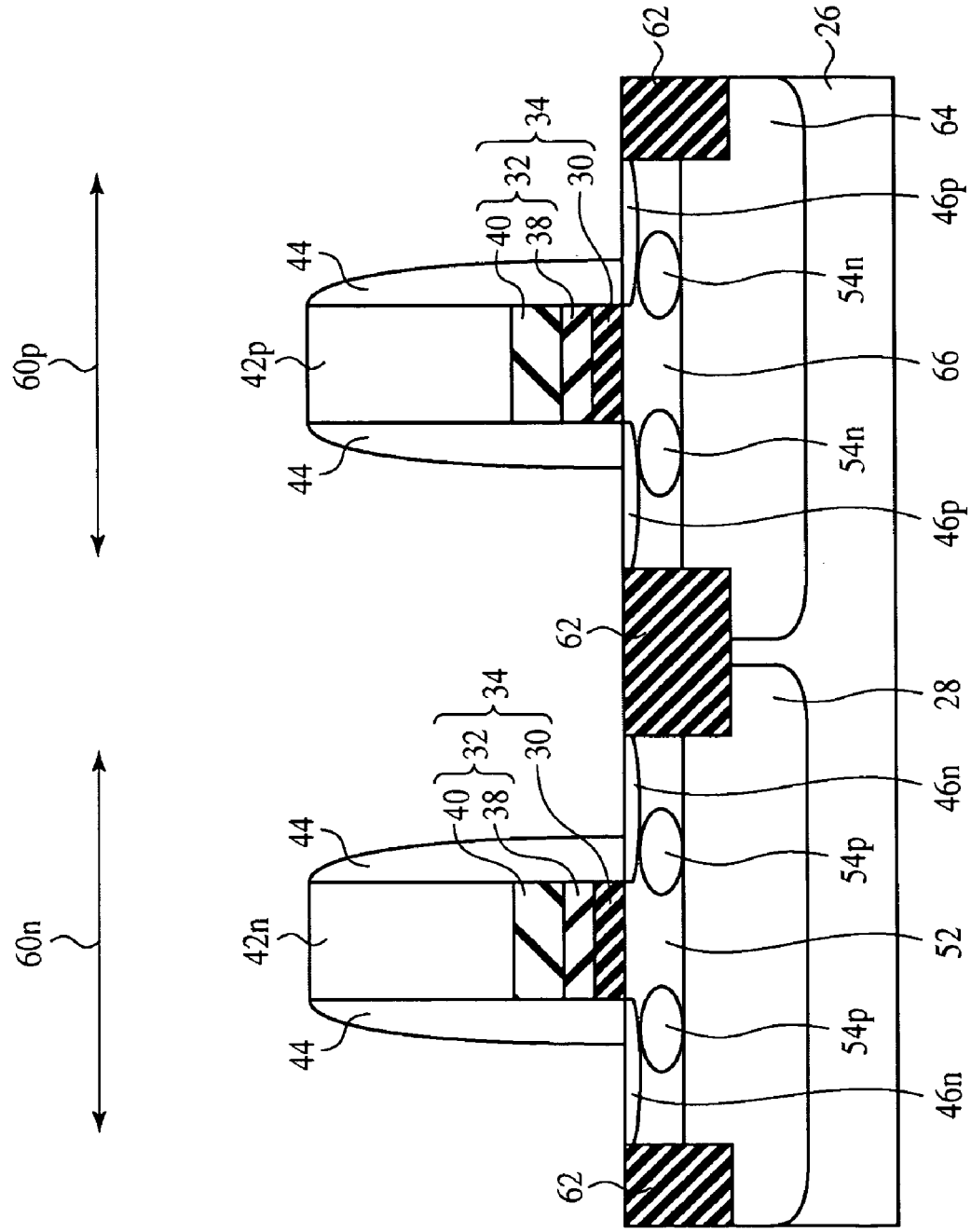

Then, a silicon oxide film, for example, is formed on the entire surface, and then the silicon oxide film is anisotropically etched. Thus, the sidewall insulating film 44 of the silicon oxide film is formed on the side walls of the gate electrodes 42n, 42p and the gate insulating film 34 (FIG. 27).

Then, by photolithography, a photoresist film 72 exposing the PMOS transistor region 60p and covering the NMOS transistor region 60n is formed.

Next, with the photoresist film 72, the sidewall insulating film 44 and the gate electrode 42p as the mask, ion implantation is made to for form the p-type impurity diffused regions 48p which are deeper than the impurity diffused regions 46p by self-alignment with the sidewall insulating film 44 and the gate electrode 42p. By this ion implantation, the p-type impurity is implanted also into the gate electrode 42p.

Figure 28:
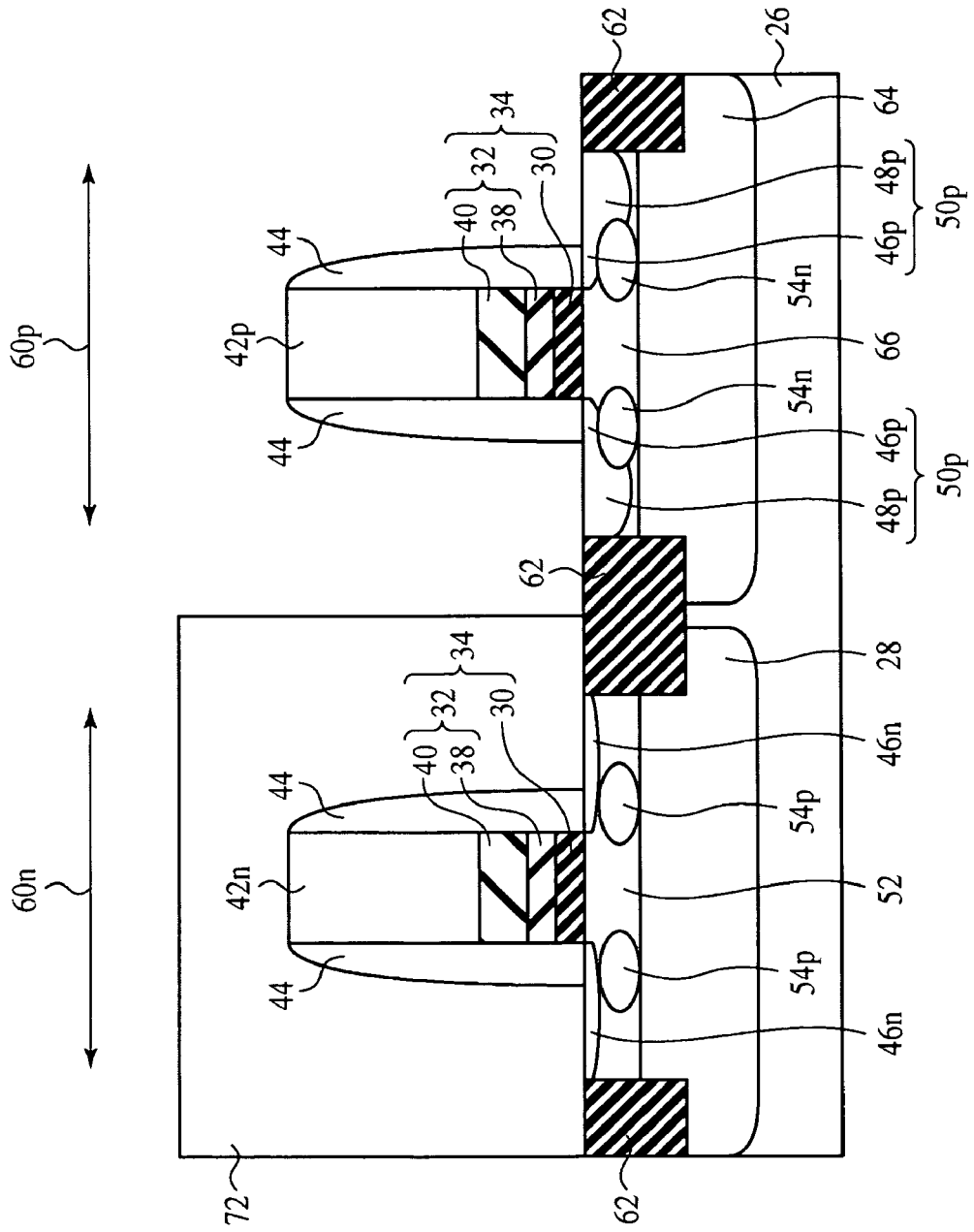

Thus, the source/drain diffused layers 50p of the extension source/drain structure formed by the impurity diffused regions 46p, 48p are formed (FIG. 28).

After ion implantation has been made in the PMOS transistor region 60p, the photoresist film 72 used as the mask is removed.

Next, by photolithography, a photoresist film 74 exposing the NMOS transistor region 60n and covering the PMOS transistor region 60p is formed.

Then, the photoresist film 74, the sidewall insulating film 44 and the gate electrode 42n as the mask, ion implantation is made to form the n-type impurity diffused regions 48n which are deeper than the impurity diffused regions 46n by self-alignment with the sidewall insulating film 44 and the gate electrode 42n. By this ion implantation, the n-type impurity is implanted also into the gate electrode 42n.

Figure 29:
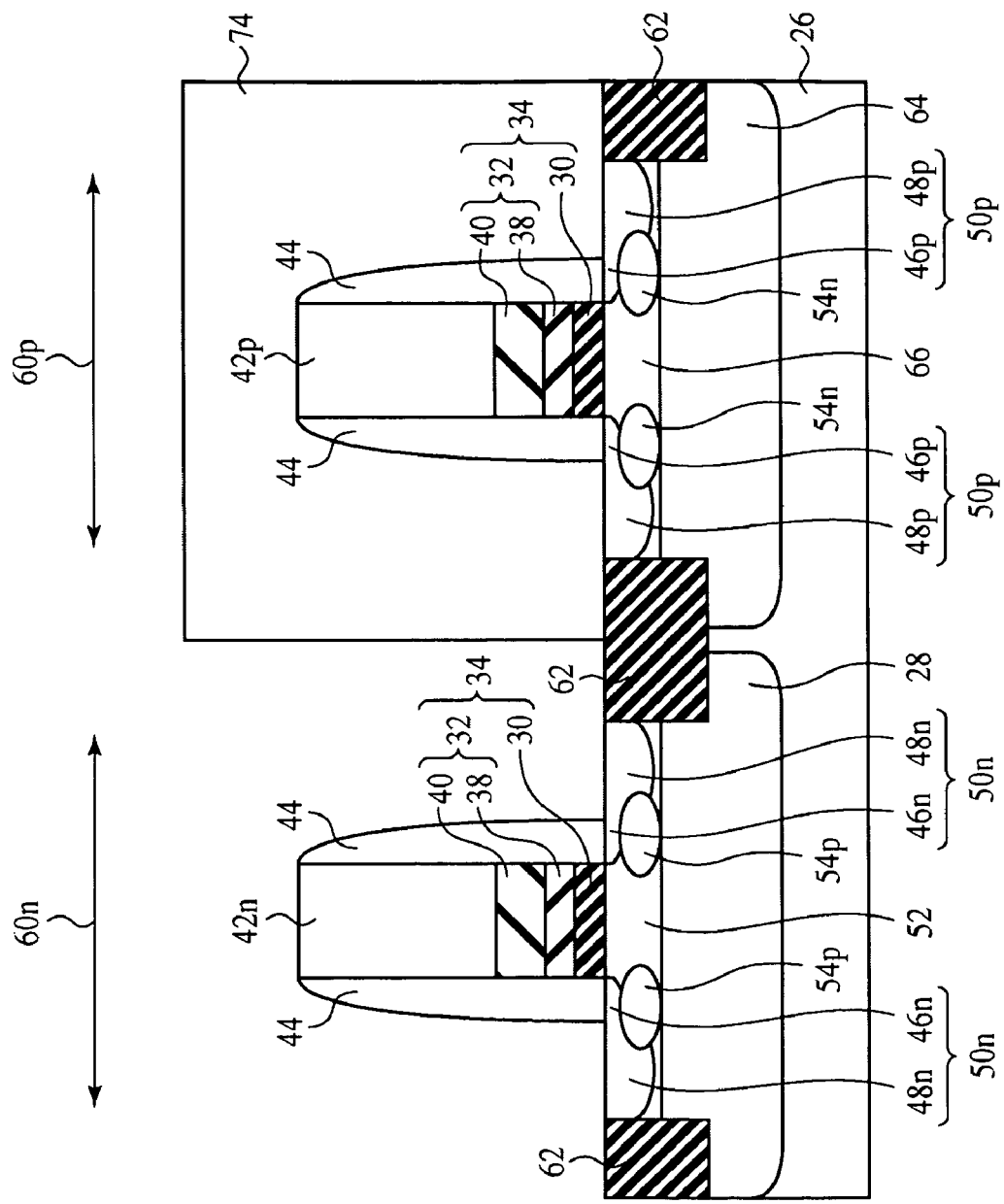

Thus, the source/drain diffused layers 50n of the extension source/drain structure formed by the impurity diffused regions 46n, 48n are formed (FIG. 29).

Figure 30:
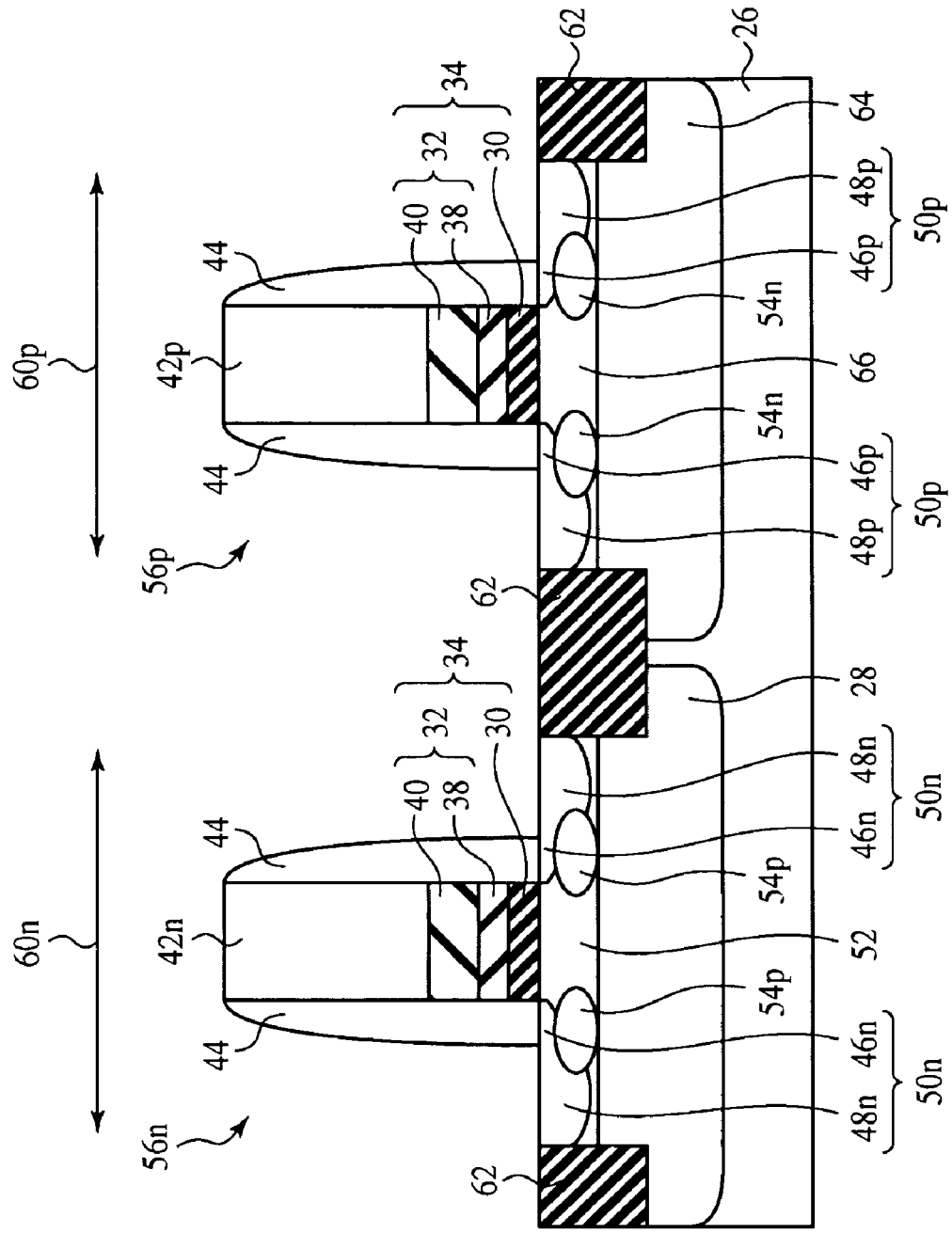

After ion implantation has been made in the NMOS transistor region 60n, the photoresist film 74 used as the mask is removed (FIG. 30).

Next, prescribed thermal processing is made to activate the impurity implanted by the ion implantation.

Thus, the semiconductor device according to the present embodiment illustrated in FIG. 19, which has the CMOS structure formed by the NMOS transistor 56n and the PMOS transistor 56p is manufactured.

As described above, according to the present embodiment, the NH$_3$ processing of exposing the HfSiO film 36 formed on the silicon substrate 26 to NH$_3$ gas is made to form the HfSiON film 38, the HfSiO film 40 to be the underlying layer of the polysilicon film 42 is formed on the HfSiON film 38, and the Al processing for adhering Al to the surface of the HfSiO film 40 is made, whereby for both the NMOS transistor 56n and the PMOS transistor 56p, the generation of the Fermi level pinning can be suppressed, and the shift of the flat band voltage $V_{fb}$ can be suppressed to control the flat band voltage $V_{fb}$ to be the idealistic value. Thus, the electric characteristics of the NMOS transistor 56n and the PMOS transistor 56p using the Hf-based high dielectric constant insulating film 32 in the gate insulating film 34 can be improved.

Modified Embodiments

The present invention is not limited to the above-described embodiments and can cover other various modifications.

For example, in the above-described embodiments, the gate electrodes 42n, 42p are formed of the polysilicon film, but the material of the gate electrodes 42n, 42p is not limited to polysilicon. The gate electrodes 42n, 42p can be formed of a conductive film containing Si, such as silicon germanium (SiGe), silicide, etc., other than polysilicon.

In the above-described embodiments, TTBA is used as the organic aluminum compound to be sprayed to the surface of the HfSiO film 40 in the Al processing. However, the organic aluminum compound to be sprayed to the surface of the HfSiO film 40 is not limited to TTBA. For example, organic aluminum compounds, such as TMA, TEA, etc., may be sprayed to the surface of the HfSiO film 40.

In the above-described embodiments, Al is adhered to the surface of HfSiO film 40, but aluminum oxide may be adhered to the surface of the HfSiO film 40.

In the above-described embodiments, the gate insulating film is formed of the Hf-based high dielectric constant insulating film. However, in the present invention, Hf-based high dielectric constant insulating film is not essential, and a wide variety of high dielectric constant insulating films of oxide, nitride oxynitride, etc. containing 1, 2 or more of elements of Hf, Al, Si, tantalum (Ta), zirconium (Zr), lanthanum (La), etc. can be used. When such high dielectric constant insulating films are used, as in the above, the high dielectric constant insulating film may have the stacked structure, the nitriding processing using NH$_3$ is made on the high dielectric constant insulating film on the substrate side, and Al processing may be made on the high dielectric constant insulating film on the side of the gate electrode.

INDUSTRIAL APPLICABILITY

The semiconductor device and method of manufacturing the same according to the present invention suppresses the generation of Fermi level pinning and the shift of the flat band voltage in the MOS transistor using high dielectric constant insulating film in the gate insulating film. Accordingly, the semiconductor device and the method of manufacturing the same according to the present invention are very useful to improve the performance of the transistor using high dielectric constant insulating film in the gate insulating film.

What is claimed is:

1. A method of manufacturing a semiconductor device comprising:
   forming a first high dielectric constant insulating film over a semiconductor substrate;
   forming a second high dielectric constant insulating film over the first high dielectric constant insulating film;
   adhering Al to a surface of the second high dielectric constant insulating film to thereby form an Al adhered layer on the surface of the second high dielectric constant insulating film;
   forming a conductive film containing Si over the second high dielectric constant insulating film with the Al adhered layer formed on the surface; and
   patterning the conductive film to form a gate electrode of the conductive film,
   wherein
   in forming the Al adhered layer, an organic aluminum compound is sprayed to the surface of the second high dielectric constant insulating film to thereby adhere Al to the surface of the second high dielectric constant insulating film.

2. The method of manufacturing a semiconductor device according to claim 1, further comprising after forming the first high dielectric constant insulating film and before forming the second high dielectric constant insulating film,
   exposing the first high dielectric constant insulating film to NH$_3$ gas.

3. The method of manufacturing a semiconductor device according to claim 2, wherein
   in exposing the first high dielectric constant insulating film to NH$_3$ gas, the first high dielectric constant insulating film is nitrided.

4. The method of manufacturing a semiconductor device according to claim 2, wherein
   before forming the conductive film, a nitrogen concentration of the second high dielectric constant insulating film is lower than a nitrogen concentration of the first high dielectric constant insulating film exposed to the NH$_3$ gas.

5. The method of manufacturing a semiconductor device according to claim 3, wherein
   before forming the conductive film, a nitrogen concentration of the second high dielectric constant insulating film is lower than a nitrogen concentration of the first high dielectric constant insulating film exposed to the NH$_3$ gas.

6. The method of manufacturing a semiconductor device according to claim 1, wherein
   before forming the conductive film, a nitrogen concentration of the second high dielectric constant insulating film is 10 atm % or below.

7. The method of manufacturing a semiconductor device according to claim 1, wherein
   in forming the conductive film, Al of the Al adhered layer is diffused into the second high dielectric constant insulating film.

8. The method of manufacturing a semiconductor device according to claim 2, wherein in forming the conductive film, Al of the Al adhered layer is diffused into the second high dielectric constant insulating film.

9. The method of manufacturing a semiconductor device according to claim 3, wherein
in forming the conductive film, Al of the Al adhered layer is diffused into the second high dielectric constant insulating film.

10. The method of manufacturing a semiconductor device according to claim 4, wherein
in forming the conductive film, Al of the Al adhered layer is diffused into the second high dielectric constant insulating film.

11. The method of manufacturing a semiconductor device according to claim 6, wherein
in forming the conductive film, Al of the Al adhered layer is diffused into the second high dielectric constant insulating film.

12. The method of manufacturing a semiconductor device according to claim 1, wherein
the organic aluminum compound is tritertiarybutylaluminum, trimethylaluminum or triethylaluminum.

13. The method of manufacturing a semiconductor device according to claim 1, wherein
in forming the Al adhered layer, the Al adhered layer of a 0.1-1 nm-thickness is formed.

14. The method of manufacturing a semiconductor device according to claim 2, wherein
in forming the Al adhered layer, the Al adhered layer of a 0.1-1 nm-thickness is formed.

15. The method of manufacturing a semiconductor device according to claim 1, wherein
in forming the first high dielectric constant insulating film, the first high dielectric constant insulating film is formed of oxide, nitride or oxynitride containing at least 1 or more elements selected from the group comprising Hf, Al, Si, Ta, Zr and La.

16. The method of manufacturing a semiconductor device according to claim 1, wherein
in forming the second high dielectric constant insulating film, the second high dielectric constant insulating film is formed of oxide, nitride or oxynitride containing at least 1 or more elements selected from the group comprising Hf, Al, Si, Ta, Zr and La.

* * * * *